US010461867B2

(12) United States Patent
Rodriguez-Perez et al.

(10) Patent No.: US 10,461,867 B2
(45) Date of Patent: Oct. 29, 2019

(54) TRANSIMPEDANCE AMPLIFIER FOR HIGH-SPEED OPTICAL COMMUNICATIONS BASED ON LINEAR MODULATION

(71) Applicant: Knowledge Development for POF SL, Madrid (ES)

(72) Inventors: Alberto Rodriguez-Perez, Madrid (ES); Luis Rolindez Alberich, Madrid (ES); Ruben Perez de Aranda Alonso, Madrid (ES)

(73) Assignee: KNOWLEDGE DEVELOPMENT FOR POF SL, Madrid (ES)

( * ) Notice: Subject to any disclaimer, the term of this patent is extended or adjusted under 35 U.S.C. 154(b) by 100 days.

(21) Appl. No.: 15/675,927

(22) Filed: Aug. 14, 2017

(65) Prior Publication Data

US 2018/0091231 A1 Mar. 29, 2018

(30) Foreign Application Priority Data

Sep. 15, 2016 (EP) .................................... 16382431

(51) Int. Cl.
*H04B 10/06* (2006.01)
*H04B 10/69* (2013.01)
(Continued)

(52) U.S. Cl.
CPC ..... *H04B 10/6931* (2013.01); *H03F 3/45475* (2013.01); *H03G 1/0035* (2013.01);
(Continued)

(58) Field of Classification Search
CPC ............ H04B 10/6931; H04B 10/6932; H04B 10/695; H03F 1/34; H03F 3/08; H03F 3/45475
(Continued)

(56) References Cited

U.S. PATENT DOCUMENTS 4,019,048 A * 4/1977 Maione .................. H04B 10/29
398/155
4,829,267 A * 5/1989 Sandusky .......... G11B 5/59627
330/257

(Continued)

FOREIGN PATENT DOCUMENTS

CN 1977473 A 6/2007
CN 101997499 A 9/2013
(Continued)

OTHER PUBLICATIONS

Extended European Search Report dated Mar. 3, 2017 for European Patent Application No. 16382431.1.
(Continued)

*Primary Examiner* — Hanh Phan
(74) *Attorney, Agent, or Firm* — Plumsea Law Group, LLC

(57) ABSTRACT

This invention relates to a optical receiver circuit (200) comprising: at least one photo detector (207) configured to convert a received light signal to an input current signal, a transimpedance amplifier circuit (201) with an input to receive the input current signal from the at least one photo detector (207) and being configured to convert the received input current signal to an output voltage signal to generate an output signal of the transimpedance amplifier circuit (201), wherein the transimpedance amplifier circuit comprises a plurality of gain amplifier stages (209, 210, 211), a DC restoration component (205), wherein the DC restoration component (205) is configured to receive the output voltage signal of the transimpedance amplifier circuit (201) for restoring the DC component of the received current signal and configured for outputting a corresponding current signal, and an automatic gain control component (204) configured for controlling via at least one programmable feedback resistor (226, 227) the equivalent transimpedance (Continued)

of the transimpedance amplifier circuit based on the signal output by the DC restoration component (205) to provide a constant output voltage amplitude for different current ranges of the input current signal.

14 Claims, 13 Drawing Sheets

(51) Int. Cl.
  *H03F 3/45* (2006.01)
  *H03G 1/00* (2006.01)
  *H03G 3/30* (2006.01)
  *H03G 3/00* (2006.01)

(52) U.S. Cl.
  CPC ........... *H03G 3/001* (2013.01); *H03G 3/3084* (2013.01); *H04B 10/6933* (2013.01); *H03F 2203/45116* (2013.01); *H03F 2203/45138* (2013.01); *H03F 2203/45288* (2013.01)

(58) Field of Classification Search
  USPC ....... 398/202, 208, 209, 210, 211, 212, 213, 398/214, 135, 136, 137, 138, 139, 158, 398/159, 164; 330/308, 59, 85, 110; 250/214 A, 214 AG, 214 LA
  See application file for complete search history.

(56) References Cited

U.S. PATENT DOCUMENTS

| | | | |
|---|---|---|---|
| 5,606,277 | A | 2/1997 | Feliz |
| 6,552,605 | B1* | 4/2003 | Yoon ........................ H03F 3/085 |
| | | | 250/214 A |
| 6,844,784 | B1 | 1/2005 | Denoyer et al. |
| 2003/0001674 | A1 | 1/2003 | Nagaraj |
| 2003/0161640 | A1 | 8/2003 | Kimura |
| 2005/0047801 | A1* | 3/2005 | Schrodinger ...... H04B 10/6933 |
| | | | 398/202 |
| 2006/0034621 | A1 | 2/2006 | Denoyer |
| 2006/0216042 | A1* | 9/2006 | Yeo ....................... H03G 3/3084 |
| | | | 398/209 |
| 2008/0197890 | A1 | 8/2008 | Yoshikawa et al. |

FOREIGN PATENT DOCUMENTS

| | | |
|---|---|---|
| CN | 204046530 U | 12/2014 |
| CN | 104539373 A | 4/2015 |
| CN | 105684304 A | 6/2016 |
| JP | 2001230637 A | 8/2001 |
| JP | 2003249831 A | 9/2003 |
| JP | 2006262003 A | 9/2006 |
| JP | 2008205614 A | 9/2008 |

OTHER PUBLICATIONS

Office Action dated Dec. 4, 2018 for Japanese Application No. 2017-175530.

* cited by examiner

TRANSIMPEDANCE AMPLIFIER FOR HIGH-SPEED OPTICAL COMMUNICATIONS BASED ON LINEAR MODULATION

BACKGROUND

The invention relates to an optical receiver circuit of the type as specified in the preamble of patent claim 1 and an optical receiver as specified in the preamble of patent claim 14.

Optical communication systems are nowadays widely used in home networks and industrial applications, for example, the MOST (Media Oriented Systems Transport) technology used in the automotive industry for high-speed multimedia networks is based on plastic over fiber (POF) technology.

In said optical communication systems, as for example described in US 2013/0330082 A1, a light emitting device, the optical transmitter, outputs an optical signal that is fed into an optical fiber link, e.g. a plastic fiber, which guides the optical signal to a light receiving device, the optical receiver, which comprises a photo detector for receiving the optical signal.

Such optical communication systems inter alia have several advantages compared with the conventional non-optical communication systems over copper: e.g. lower attenuation, immunity to electromagnetic interference irradiation and higher data rate transmission. In recent years optical communication systems are therefore more and more also used for in-vehicle data communication.

Current optical communication systems however are inter alia suffering from the challenge that, the optical communication system, in particular the performance of the optical receiver, does not adequately deal with variations in received optical powers that can span several orders of magnitude, resulting in undesired noisy and non-linear behavior of the electric output signal of the optical receiver.

Furthermore, the performance of the optical receiver can degrade due to, for example, undesired fluctuations in voltage, temperature and/or due to local process variations (also called process variations for brevity), i.e. due to naturally occurring variations in the attributes of electronic components such as transistors when electronic integrated circuits are manufactured.

SUMMARY

It is therefore the object of the present invention to provide means for improving an optical communication system. For example, the object may comprise improving the performance and reliability of an optical communication system, in particular, improving the performance and reliability of an optical receiver of an optical communication system.

According to the present invention, this object is achieved by an optical receiver circuit according to claim 1 and an optical receiver according to claim 14. Advantageous embodiments and further developments are the subject matter of the subclaims.

For example, an optical receiver circuit for use in an optical communication system can comprise one, some or all of the following components:
- at least one photo detector, e.g. a photo diode, configured to convert a received light signal to an input current signal, e.g. a photocurrent,
- a transimpedance amplifier circuit (TIA) with an input to receive the input current signal from the at least one photo detector and being configured to convert the received input current signal to an output voltage signal to generate an output signal of the transimpedance amplifier circuit, wherein the transimpedance amplifier circuit can comprise a plurality of gain amplifier stages,
- a DC (direct current) restoration component, wherein the DC restoration component is configured to receive the output voltage signal of the transimpedance amplifier circuit for restoring the DC component of the received current signal and configured for outputting a corresponding current signal, and
- an automatic gain control component configured for controlling via at least one programmable feedback resistor the equivalent transimpedance of the transimpedance amplifier circuit based on the signal output by the DC restoration component for providing a constant output voltage amplitude for different current ranges of the input current signal.

An optical receiver circuit for use in an optical receiver of an optical communication system ac-cording to the present invention has inter alia the advantage that the linearity of the optical receiver is improved, i.e. in particular the linearity of the conversion of the input current signal, e.g. the photo-current signal generated by the at least one photo detector, to an output signal, i.e. an output voltage signal, of the optical receiver. In particular, for example, the implementation of the automatic gain control can avoid the saturation of the transimpedance amplifier circuit output voltage for high input current signals, i.e. high input photocurrents that, for example, can be 3, 4 or more magnitudes larger than the smallest occurring input photocurrents, and can thereby reduce output distortion. For example, if the lowest input photocurrents are 100 nA, saturation of the transimpedance amplifier circuit output voltage can be avoided for input photocurrents up to 1 mA or higher.

Furthermore, the design of an optical receiver circuit for use in an exemplary optical receiver according to the present invention can provide a high linearity for said conversion of an input signal, e.g. input current signal, to an output signal, e.g. output voltage signal, for a wide dynamic range of input signals, i.e. for a wide dynamic range of the input current signal.

For example, the input current signal, e.g. the photocurrent signal generated by the conversion of a light input signal to a photo current by the at least one photo detector, may vary over three orders of magnitude or more, and the design of an optical receiver circuit according to the pre-sent invention can reduce or avoid a degradation of the linearity of the output of the transimpedance amplifier circuit, respectively the output of the optical receiver circuit, even for such a wide dynamic range of the input current signal.

In fact an optical receiver circuit for use in an exemplary optical receiver can, in particular due to its automatic gain control component, provide a constant amplitude of the output signal, e.g. a constant amplitude of an output voltage signal independently of the amplitude or level or optical power of the received input current signal or photocurrent signal.

An optical receiver circuit according to the present invention advantageously allows an automatic adjustment of the equivalent transimpedance of its transimpedance amplifier circuit adapted to a given input current signal level, such that the desired correct level of the output signal, e.g. the amplitude of the output voltage signal, can be obtained and outputted by the optical receiver.

The design of an optical receiver circuit according to the present invention also provides, in particular due to the plurality of gain amplifier stages, a higher equivalent bandwidth of an/the optical receiver.

The design of an optical receiver circuit for use in an optical receiver according to the present invention is also ideally suited to receive and process advanced light modulation schemes, such as a light input signal from a light emitting diode that is, for example, linearly modulated based on the so-called pulse-amplitude-modulation (PAM) technique.

In contrast to a conventional binary on-off keying modulation, in the pulse-amplitude-modulation (PAM) technique a plurality of distinct pulse amplitude levels mapped to plurality of bits can be used to convey information. For example, each amplitude level represents a plurality of bits, e.g. a pair of bits, such that a single amplitude level can transmit more than one bit, thereby increasing the bandwidth efficiency of the optical communication system.

In addition, an optical receiver circuit according to the present invention facilitates the conversion of the input signal, e.g. of the input current signal or input photo current signal, to an output signal, e.g. an output voltage signal, with an amplitude or signal-to-noise ratio high enough to neglect the noise contribution of possible further subsequent components or blocks of an optical communication system.

The plurality of gain amplifier stages of the transimpedance amplifier circuit can be followed by a unity gain amplifier or voltage follower to isolate an/the output node of the transimpedance amplifier circuit.

The at least some of the gain amplifier stages can comprise a gain amplifier and at least one local programmable feedback resistor for controlling the gain of the respective gain amplifier stage, and wherein the automatic gain control component is further configured to control at least some of the local programmable feedback resistors of the gain amplifier stages based on the signal output by the DC restoration component.

Said local programmable feedback resistors for controlling the gain of the respective gain amplifier stage can inter alia help to ensure the feedback stability of the optical receiver circuit.

The at least one programmable feedback resistor for controlling the equivalent transimpedance of the transimpedance amplifier circuit of the optical receiver circuit can be arranged between the input of transimpedance amplifier circuit and the output signal of the transimpedance amplifier circuit.

The optical receiver circuit can further comprise a plurality of programmable feedback resistors for controlling the equivalent transimpedance of the transimpedance amplifier circuit, wherein at least some of the programmable feedback resistors for controlling the equivalent transimpedance of the transimpedance amplifier circuit can be connected between the input of the transimpedance amplifier circuit and the outputs of the different gain amplifier stages.

It is further noted, that the programmable feedback resistors of the optical receiver circuit can be voltage controlled and that the automatic gain control component can be in communication with some or all programmable feedback resistors, i.e., for example, with both the at least one local programmable feedback resistor for controlling the gain of the respective gain amplifier stage and with the at least one programmable feedback resistor for controlling the equivalent transimpedance of the transimpedance amplifier circuit based on the signal output by the DC restoration component.

This way, for example, most or all programmable resistors of the optical receiver circuit can be controlled at the same time.

An exemplary optical receiver circuit can further comprise a fixed resistor connected between the input and the output signal of the transimpedance amplifier circuit for limiting the maximum equivalent transimpedance of the transimpedance amplifier circuit.

Furthermore, the DC restoration component of an exemplary optical receiver circuit can be configured to subtract the DC component of the received current signal and the automatic gain control component can further be configured for controlling the equivalent transimpedance of the transimpedance amplifier circuit based on a copy of the subtracted DC component.

The subtracted DC component of the received current signal can provide a good estimate of the input current level and can be used directly to set the equivalent transimpedance to obtain a desired output voltage value. This exemplary DC restoration component design can therefore inter alia dispense with the difficult task of having to constantly monitor the maximum output voltage amplitude.

An exemplary optical receiver circuit can further comprise two photo detectors, wherein one photo detector is configured to receive the light signal and the other photo detector is shielded from the light signal and wherein the transimpedance amplifier circuit can have a differential topology, for example, with one branch, e.g. the positive branch, of the transimpedance amplifier circuit being connected to the photo detector that is configured to receive the light signal and with the other branch, e.g. the negative branch, of the transimpedance amplifier circuit being connected to the photo detector that is shielded from the light signal.

Alternatively, an exemplary optical receiver circuit can be a transimpedance amplifier circuit with a differential topology with, for example, one branch, e.g. the positive branch, of the transimpedance amplifier circuit being connected to the photo detector that is configured to receive the light signal and with the other branch, e.g. the negative branch, of the transimpedance amplifier circuit being connected to an equivalent electrical model of the photodiode, for example, to a circuit comprising a resistor and/or capacitor.

Such exemplary differential topologies of the optical receiver circuit or transimpedance amplifier circuit can, for example, have the advantage, that the Power Supply Rejection Ratio (PSRR) and/or the Common Mode Rejection Ratio (CMRR) and/or the common noise immunity of the optical receiver circuit or transimpedance amplifier circuit can be improved.

Furthermore, in an exemplary optical receiver circuit at least some of the local programmable feedback resistors for controlling the gain of the gain amplifier stages can be connected to local inputs and outputs of some of the gain amplifier stages.

In addition at least some of the local programmable feedback resistors for controlling the gain of the gain amplifier stages can, for example, be arranged to shorten the outputs of some of the gain amplifier stages.

Furthermore, the optical receiver circuit can, for example, optionally or additionally comprise at least one programmable shunt resistor that can be arranged to shorten an/the output a/the last gain amplifier stage of the transimpedance amplifier circuit. However, it is also conceivable that a shunt resistor is also used in other gain amplifier stage of the transimpedance amplifier circuit.

An optical receiver circuit can further comprise at least one gain amplifier stage that can comprise a differential pair, e.g. cascoded transistor, with a resistive load, $R\_load$, or with an active load, for example, with a p-channel metal-oxide-semiconductor field-effect transistor, PMOS, load.

A cascoded transistor can inter alia allow increasing the equivalent impedance of an/the input differential pair, thereby obtaining a higher gain.

In addition, at least one, some, or each gain amplifier stage of the optical receiver circuit can comprise a common-mode control circuit for providing a signal suitable for controlling the re-verse bias voltage of the photo detector.

An exemplary optical receiver circuit can further be configured to carry out one, some or all of the following steps:
- calculate an average current of the current signal generated by the at least one photo detector, for example, based on a copy of the current outputted by the DC restoration component,
- use the calculated average current to calculate a required equivalent transimpedance of the transimpedance amplifier circuit and for controlling the equivalent transimpedance of the transimpedance amplifier circuit to provide a constant output voltage amplitude for different current ranges of the input current signal, and
- reduce the gain of the gain amplifier stages, e.g. for improving the stability of the optical receiver circuit.

Therein, the step of using the calculated average current to calculate a required equivalent transimpedance of the transimpedance amplifier circuit can further, for example, comprise determining or calculating a suitable configuration of the programmable feedback resistors for controlling the equivalent transimpedance of the transimpedance amplifier circuit to provide a constant output voltage amplitude for different current ranges of the input current signal.

Said steps can, for example, be carried out or can be controlled by the automatic gain control component.

Furthermore, it is possible that the optical receiver circuit or automatic gain control component is configured for carrying out one, some or all of the following steps for controlling the equivalent transimpedance of the transimpedance amplifier circuit:
- use the current outputted by the DC restoration component to calculate a required equivalent transimpedance of the transimpedance amplifier circuit,
- start reducing the equivalent transimpedance of the transimpedance amplifier circuit by reducing the impedance of the at least one programmable feedback resistor connected between the input and output of the transimpedance amplifier circuit,
- once the impedance of the at least one programmable feedback resistor connected between the input and output of the transimpedance amplifier circuit is set to a given minimum value, sequentially reducing the impedance of possible further programmable feedback resistors connected between the input of the transimpedance amplifier circuit and outputs of different gain amplifier stages, for example, by starting with reducing the impedance of a programmable feedback resistor connected between the input of the transimpedance amplifier circuit and the output of the last gain amplifier stage.

In addition, the automatic gain control component of the optical receiver circuit can further be configured to carry out the step of:
- controlling the gain of the gain amplifier stages by controlling, e.g. reducing, in sequence the resistive feedback of the local programmable feedback resistors of the gain amplifier stages, for example, by starting controlling, e.g. reducing, the resistive feedback of the local programmable feedback resistor of the last gain amplifier stage.

The above exemplary described steps provide exemplary control steps and/or exemplary sequences for controlling the equivalent transimpedance of the transimpedance amplifier circuit and for improving the stability of the optical receiver circuit.

In particular these exemplary steps can improve the linear scaling of the equivalent transimpedance of the transimpedance amplifier circuit of the optical receiver circuit.

Furthermore, the herein exemplary described automatic gain control component of the optical receiver circuit can provide a continuous and linear gain control and continuous and linear equivalent transimpedance control, i.e. a linear gain and equivalent transimpedance control that is not based on discrete steps.

In an exemplary optical receiver circuit, some or each of the programmable feedback resistors can comprise a plurality of transistors connected in parallel and wherein the resistance of the programmable feedback resistors is controlled via the gate voltage of their transistors, and wherein some or all of the transistors of a programmable feedback resistor can have different characteristics, for example, can differ in scale or size, e.g. differ in their gate-width-to-gate-length ratio, e.g. increasing in their gate-width-to-gate-length ratio from the first to the last transistor of the respective programmable feedback resistor.

The possible different characteristics of said transistors can inter alia reduce linearity problems and improve the operation of the programmable feedback resistors at ohmic region for the full dynamic range.

It is further conceivable that the transistors of a programmable feedback resistor of the optical receiver circuit can be configured to be activated in sequence, for example, can be configured to be activated in sequence from the first to the last transistor of the respective programmable feedback resistor.

Furthermore, a successively activation of the transistors from smaller gate-width-to-gate-length ratio to bigger gate-width-to-gate-length ratio is possible.

Such exemplary successively activations of the transistors of the programmable feedback resistors of the optical receiver circuit can improve the linearity of equivalent transimpedance transitions, for example, the linearity of equivalent transimpedance transitions from low equivalent transimpedance values to high equivalent transimpedance values.

It is further pointed out that the programmable feedback resistors of the optical receiver circuit can comprise different numbers of said transistors and with different transistor characteristics, e.g. differences in scale or size, e.g. differences in gate-width-to-gate-length ratio.

An exemplary DC restoration component of the optical receiver circuit can comprise a sequential voltage generator.

An exemplary sequential voltage generator can comprise a plurality of scaled transistors, and said scaled transistors can be configured for increasing the DC current output of the DC restoration component, and in particular, for example to generate a set of sequential voltage control bits to control the gate voltages of the transistors which can generate the DC current output of the DC restoration component.

In particular, the optional sequential voltage generator of DC restoration component can activate sequentially said plurality of parallel scaled transistors to generate the DC input current component to be removed from the input of the transimpedance amplifier circuit.

In addition, the DC restoration component can comprise a low-pass filter connected to the output of the transimpedance amplifier circuit, wherein the output of the low-pass filter can be used as input for the sequential voltage generator, wherein, for example, the output of the sequential voltage generator can be used to control the gate voltage of some parallel transistors that generate the DC current output, and wherein the DC current output of the DC restoration component can be connected to the output of the at least one photo detector that can be connected to the input of the transimpedance amplifier circuit of the optical receiver circuit.

Such an exemplary DC restoration component can inter alia remove the DC component of the photodiode output current and reduce the noise injected in the transimpedance amplifier circuit and lead to an improved performance of the optical receiver circuit.

Moreover, the optical receiver circuit can comprise an automatic gain control component that, for example, can comprise a dummy transimpedance amplifier circuit that can be a scaled version of a transimpedance amplifier circuit as described above.

Said dummy transimpedance amplifier circuit can thereby comprise a plurality of dummy gain amplifier stages, wherein the dummy transimpedance amplifier circuit can be configured to receive as input a copy of the DC current outputted by the DC restoration component.

The optional and exemplary dummy transimpedance amplifier circuit can further be configured for converting a received input current signal to a voltage signal to generate an output signal for controlling the equivalent transimpedance of the transimpedance amplifier circuit.

Thereby each dummy gain amplifier stage, for example, can comprise a dummy gain amplifier and at least one dummy local programmable feedback resistor.

For example, the dummy transimpedance amplifier circuit may have a smaller bandwidth than the original transimpedance amplifier circuit but can, for example, have the same DC characteristics for ensuring a correct calibration.

The possible exemplary dummy transimpedance amplifier circuit can thereby have the same equivalent transimpedance for a given programmed state of the dummy programmable feed-back resistors than the equivalent transimpedance of the transimpedance amplifier configured with the same programmed state of the programmable feedback resistors.

Besides, the exemplary automatic gain control component can be configured to carry out one, some or all of the following steps:
  use a copy of the DC current outputted by the DC restoration component as an input of the dummy transimpedance amplifier circuit to transform this current into a voltage proportional to the required transimpedance,
  compare the output of the dummy transimpedance amplifier circuit to a given reference voltage, and based on this comparison, generate a set of gate control voltages to program the transimpedance of the dummy transimpedance amplifier circuit by means of the dummy programmable feedback resistors, and
  use the generated gate control voltages to set the equivalent transimpedance of the transimpedance amplifier circuit to a value that sets the output voltage amplitude of the transimpedance amplifier circuit to a desired value.

In addition the scale of the dummy transimpedance amplifier circuit as compared to the original transimpedance amplifier circuit can be optimized to reduce energy and current consumption.

An exemplary optical receiver for use in an optical communication system can comprise at least one optical receiver circuit according to any of the configurations described above and/or ac-cording to any possible combination of the exemplarily features described above.

In summary the architecture, exemplarily described above, of an optical receiver circuit or optical receiver for use in an optical communication system can inter alia provide some or all of the following advantages:
  high-bandwidth and high-linearity over a wide dynamical range of optical power input levels, e.g. from −24 dBm to 0 dBm or more, in order to accommodate high-speed optical communications based on linear modulations
  automatic and linear gain control optical receiver circuit
  wide equivalent transimpedance range, e.g. from a few ohm to several hundreds of kohm, e.g. from 500 ohm to 300 kohm
  constant output amplitude
  stability
  continuous gain control, i.e. not based on discrete steps
  operation of transistors in ohmic region
  minimize input referred noise
  keeping a constant low frequency corner for the closed-loop response of the transimpedance amplifier circuit and the DC restoration
  fully differential operation, thereby ensuring a good Power Supply Ratio (PSRR) and a good Common Mode Rejection Ratio (CMRR) and differential noise rejection
  adaptability to technological process and temperature variations
  common-mode control to keep a proper reverse bias voltage at the photo detector, e.g. at the photo diode
  sequential voltage control for programmable feedback resistors and input DC restoration control.

BRIEF DESCRIPTION OF DRAWINGS

The following figures illustrate exemplary.

DETAILED DESCRIPTION

Figure 1:
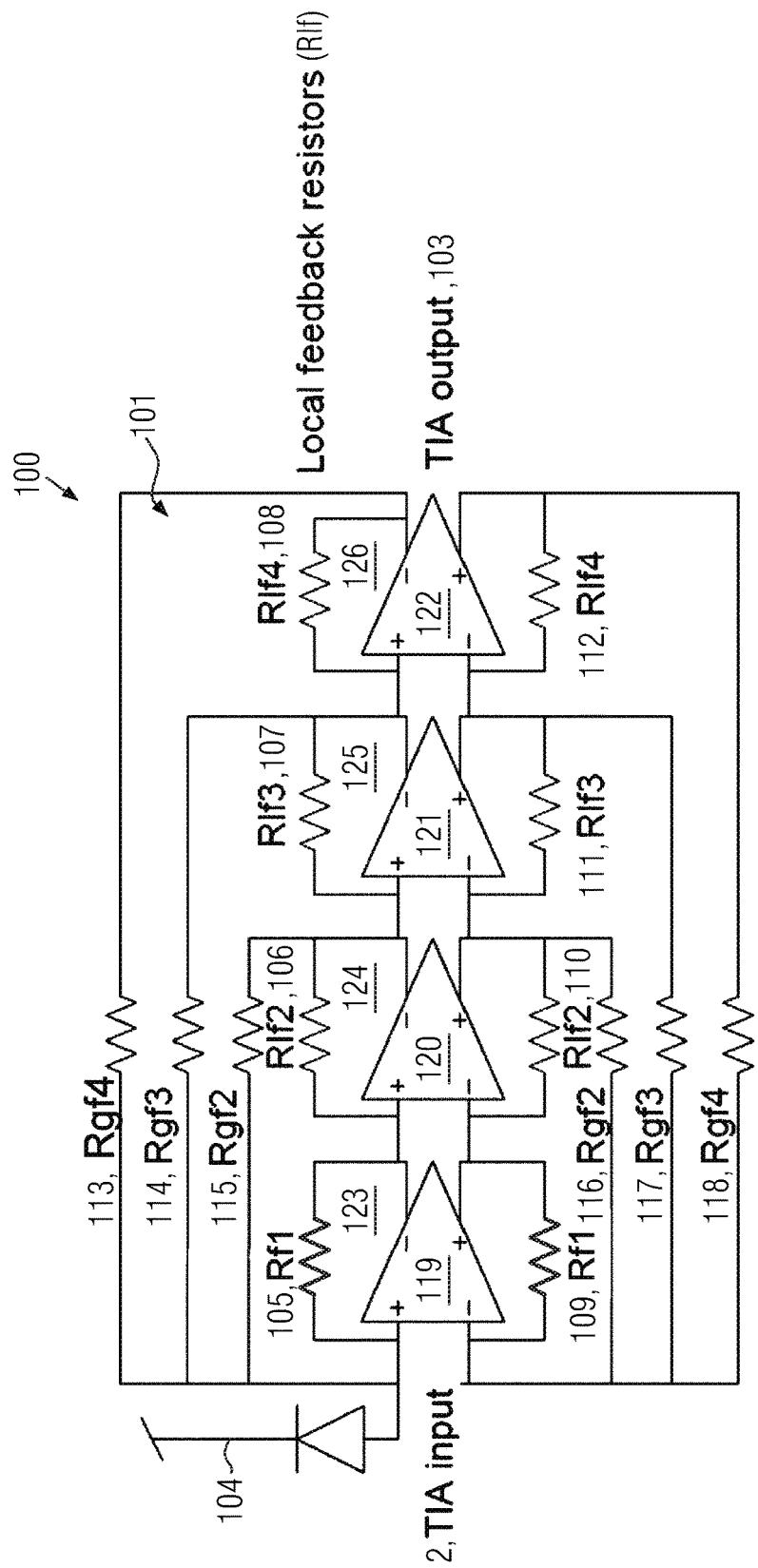
FIG. 1: Exemplary schematic architecture of parts of an optical receiver circuit, e.g. an exemplary transimpedance amplifier circuit and an exemplary photo diode

FIG. 1 exemplary shows a possible architecture of parts 100 of an optical receiver circuit, in particular comprising an exemplary transimpedance amplifier circuit 101 and an exemplary photo diode 104.

In particular, an exemplary transimpedance amplifier circuit 101 is shown with an input 102 to receive an input current signal from the at least one photo detector 104 and being configured to convert the received input, e.g. an input current signal, to an output voltage signal 103 to generate an output signal 103 of the transimpedance amplifier circuit.

The DC restoration component and the automatic gain control component are not shown in this example.

Furthermore, it is exemplary shown that the transimpedance amplifier circuit 101 comprises an exemplary plurality of gain amplifier stages, e.g. exemplary gain amplifier stages 123, 124, 125, 126. Any other number of gain amplifier stages can be implemented as well.

Said exemplary gain amplifier stages 123, 124, 125, 126 comprise exemplary gain amplifiers 119, 120, 121, 122 and exemplary local programmable feedback resistors (Rlfs) 105, 109, 106, 110, 107, 111, 108 and 112.

Furthermore, an exemplary plurality of further programmable feedback resistors 113, 118, 114, 117, 115 and 116 for controlling the equivalent transimpedance of the transimpedance amplifier circuit 101 are shown.

For completeness it is noted, that programmable feedback resistors for controlling the equivalent transimpedance of the transimpedance amplifier circuit 101 that are connected between the input 102 of the transimpedance amplifier circuit 101 and the output, i.e. output signal 103, or that are connected between the input 102 of the transimpedance amplifier circuit 101 and outputs of different gain amplifier stages, may also be referred to as global programmable feedback resistors.

It is further noted that the local programmable feedback resistors 105 and 109 can be under-stood also as a (global) programmable feedback resistors for controlling the (equivalent) transimpedance of the transimpedance amplifier circuit 101 in case of using/having only a single/the first gain amplifier stage 123.

An exemplary sequence for controlling the equivalent transimpedance of the transimpedance amplifier circuit 101 may comprise:
  reducing resistance of programmable feedback resistor(s) 113, 118, Rgf4
  reducing resistance of programmable feedback resistor(s) 114, 117, Rgf3
  reducing resistance of programmable feedback resistor(s) 115, 116, Rgf2
  reducing resistance of programmable feedback resistor(s) 105, 109, Rf1

An exemplary sequence for controlling the gain of the transimpedance amplifier circuit 101 may comprise:
  reducing resistance of programmable feedback resistor(s) 108, 112, Rlf4
  reducing resistance of programmable feedback resistor(s) 107, 111, Rlf3
  reducing resistance of programmable feedback resistor(s) 106, 110, Rlf2
  reducing resistance of programmable feedback resistor(s) 105, 109, Rf1

Figure 2:
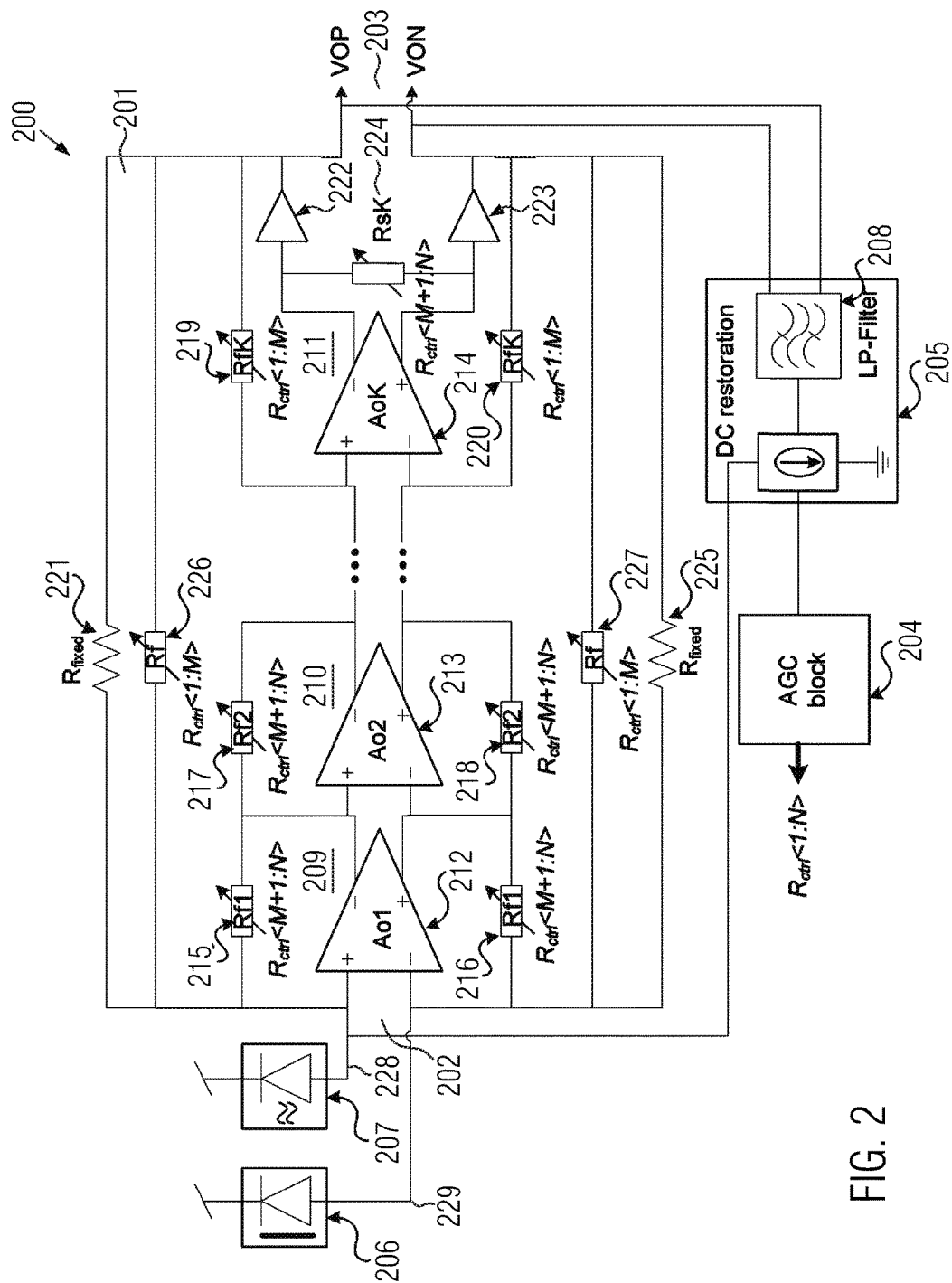
FIG. 2: Exemplary schematic architecture of an optical receiver circuit

FIG. 2 exemplary shows a further possible architecture of an optical receiver circuit 200. Said exemplary optical receiver circuit 200 can comprise an automatic gain control component 204 and DC restoration component 205, wherein said DC restoration component 205 can inter alia comprise a low-pass filter 208.

Furthermore, the optical receiver circuit 200 comprises an exemplary transimpedance amplifier circuit 201 with input 202 and output 203 and with an exemplary plurality of gain amplifier stages, from which only an exemplary subset, namely the gain amplifier stages 209, 210, 211 are explicitly shown and denoted.

Said gain amplifier stages can, analogous to the transimpedance amplifier circuit depicted in FIG. 1, comprise exemplary gain amplifiers 212, 213, 214 and exemplary local programmable feedback resistors 215, 216, 217, 218, 219 and 220.

Furthermore, an exemplary shunt programmable resistor 224 is shown that can short the output of the last gain amplifier stage 211.

Also the transimpedance amplifier circuit 201 may comprise a plurality of programmable feed-back resistors, e.g. global programmable feedback resistors, 226, 227 for controlling the equivalent transimpedance of the transimpedance amplifier circuit, wherein said programmable feedback resistors, e.g. global programmable feedback resistors, 226, 227 for controlling the equivalent transimpedance of the transimpedance amplifier circuit can be connected between the input 202 of the transimpedance amplifier circuit 201 and the output 203 of the transimpedance amplifier circuit 201 or between the input 202 of the transimpedance amplifier circuit 201 and the outputs of different gain amplifier stages.

In addition a fixed resistor 221, 225 connected in parallel between input and output of transimpedance amplifier circuit 201 can be used to limit the maximum value of the equivalent transimpedance of the transimpedance amplifier circuit 201. Furthermore, exemplary buffers 222, 223 are shown that can isolate the output of the last gain amplifier stage 211.

Moreover, the exemplary optical receiver circuit 200 can comprise two photo detectors, e.g. photo diodes, 206, 207, wherein one photo detector 207 is configured to receive the input light signal and the other photo detector 206 is shielded from the input light signal and the transimpedance amplifier circuit 201 can have a differential topology with one branch 228, e.g. the positive branch, of the transimpedance amplifier circuit 201 being connected to the photo detector 207 that is configured to receive the light signal and with the other branch 229, e.g. the negative branch, of the transimpedance amplifier circuit 201 being connected to the photo detector 206 that is shielded from the light signal. However, it is also conceivable, that, for example, said possible negative branch of the transimpedance amplifier circuit could be connected to an equivalent electrical model (not shown) of a photo detector, e.g. an equivalent electrical model of a photodiode, for example, to a circuit comprising a resistor and/or capacitor.

Such a possible differential architecture can inter alia improve the Power Supply Ratio (PSRR) and Common Mode Rejection Ratio (CMRR) as well as the common noise immunity.

As described above, the automatic gain control component 204 can be in communication with some or all programmable feedback resistors of the optical receiver circuit 200, i.e., for example, with both the local programmable feedback resistors 215, 216, 217, 218, 219, 220 for controlling the gain of the respective gain amplifier stage and with some or all of the programmable feedback resistors 226, 227 for controlling the equivalent transimpedance of the transimpedance amplifier circuit based on the signal output by the DC restoration component 205.

For completeness, it is noted that the terms $R_{ctrl}$ <M+1:N> and $R_{ctrl}$ <M+1:N> shown in FIG. 2 can be understood as referring to the possible plurality of transistors comprised in the programmable feedback resistors. As mentioned before, said programmable feedback resistors can follow an activation sequence, for example, resistors 226, 227, 219 and 220 can be activated first, and after, resistors 215, 216, 217, 218.

Figure 3:
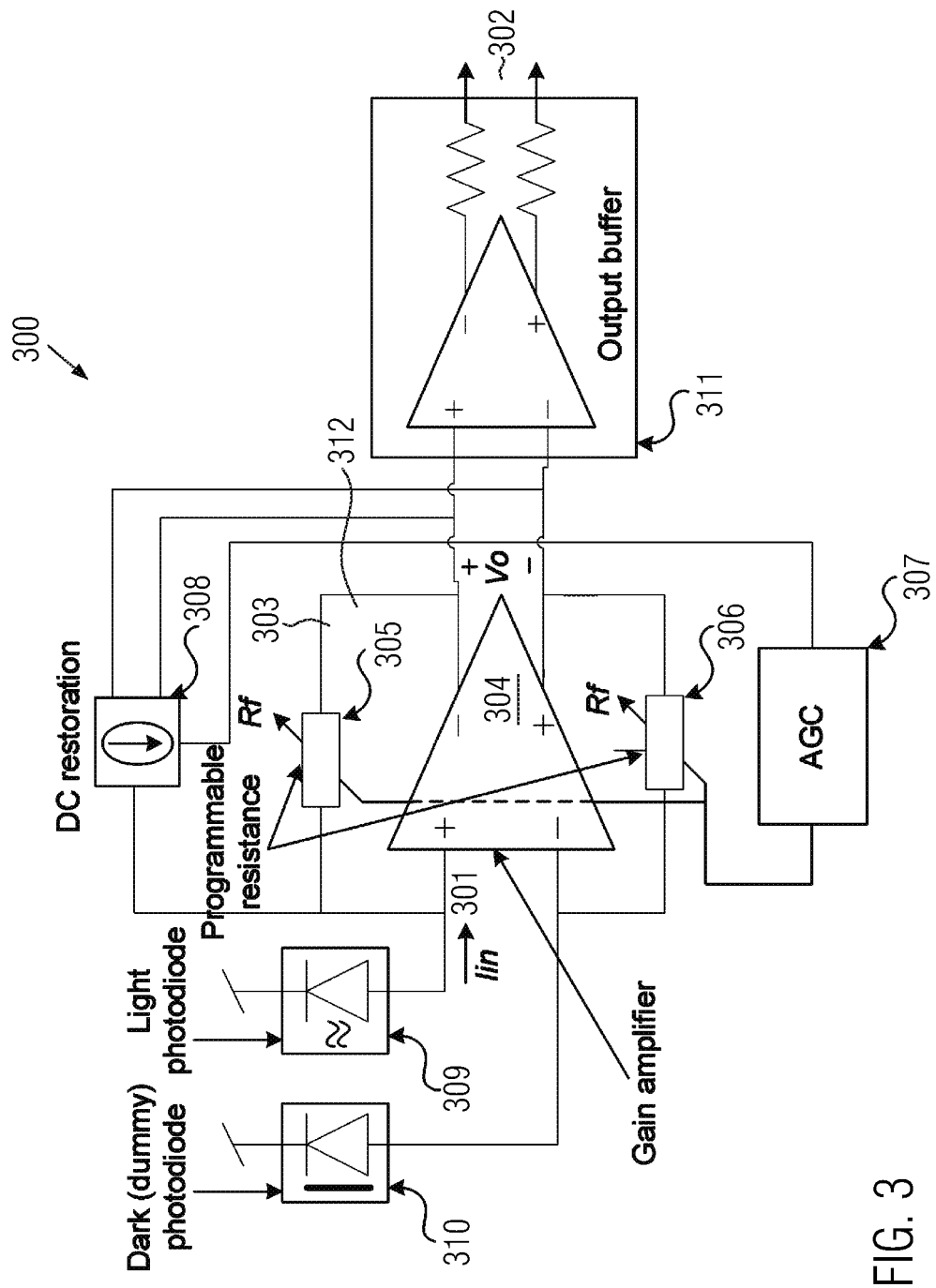
FIG. 3: Further exemplary schematic architecture of an optical receiver circuit

FIG. 3 exemplary shows a possible architecture of an optical receiver circuit 300 for the purpose of better understanding some aspects of the present invention.

Said exemplary optical receiver circuit 300 can comprise an automatic gain control component 307 and DC restoration component 308, wherein said DC restoration component 308 can inter alia comprise a low-pass filter (not shown).

Furthermore, the optical receiver circuit 200 comprises an exemplary transimpedance amplifier circuit 303 with input 301 and output 302 and with an exemplary gain amplifier stage 312.

Said gain amplifier stage 312 can, analogous to the transimpedance amplifier circuits depicted before, comprise an exemplary gain amplifier 304 and exemplary local programmable feedback resistors 305 and 306 that in the case shown also can act as global programmable feedback resistors and for controlling the (equivalent) transimpedance of the transimpedance amplifier circuit 303 based on the signal output by the DC restoration component 308 to provide a constant output voltage amplitude for different current ranges of the input current signal.

The gain of the gain amplifier stage(s) should preferably be sufficiently high in order to get the maximum bandwidth of the current to voltage transimpedance amplifier response, in particular for high equivalent transimpedance values.

Preferably, and as described above, the transimpedance amplifier circuit can therefore comprise more than one gain amplifier stage.

In particular and in general it holds that a higher bandwidth for a higher (equivalent) transimpedance of the transimpedance amplifier circuit requires a higher gain of the gain amplifier(s) of the gain amplifier stage(s).

For example, the bandwidth ω-3 dB of the transimpedance amplifier circuit with respect to the 3-dB point can be approximated by $$\omega_{-3dB} \approx \frac{\sqrt{2} A_0}{R_F C_T}$$

wherein, for example, $A_G$ is the open-loop gain of the gain amplifier of a gain amplifier stage, $R_F$ is the equivalent resistance of a feedback resistor and $C_F$ is the total equivalent input capacitance of the gain amplifier.

For example, for a bandwidth of about 150 MHz and exemplary values of $R_F \approx 200$ kΩ and $C_F \approx 4$ pF a DC gain of at least about 60 dB would be required.

Furthermore, the transimpedance amplifier circuit 303 can comprise/can be followed by an output buffer 311, e.g. a unity gain amplifier or voltage follower, to isolate an/the output node of the transimpedance amplifier circuit.

Analogous to FIG. 2, the exemplary optical receiver circuit 300 can comprise two photo detectors, e.g. photo diodes, 310, 309, wherein one photo detector 309 is configured to receive the input light signal and the other photo detector 310 is shielded from the input light signal and the transimpedance amplifier circuit 303 can have a differential topology with one branch, e.g. the positive branch, of the transimpedance amplifier circuit 303 being connected to the photo detector 309 that is configured to receive the light signal and with the other branch, e.g. the negative branch, of the transimpedance amplifier circuit 303 being connected to the photo detector 310 that is shielded from the light signal. However, it is also conceivable, that, for example said possible negative branch of the transimpedance amplifier circuit could be connected to an equivalent electrical model (not shown) of a photo detector, e.g. an equivalent electrical model of a photodiode, for example, to a circuit comprising a resistor and/or capacitor.

For completeness it is noted that the photo detector, e.g. photo diode 309, is connected to VDD for illustration purposes only, other connections, such as anode to ground, are also possible, depending on the nature of the photo diode.

Figure 4:
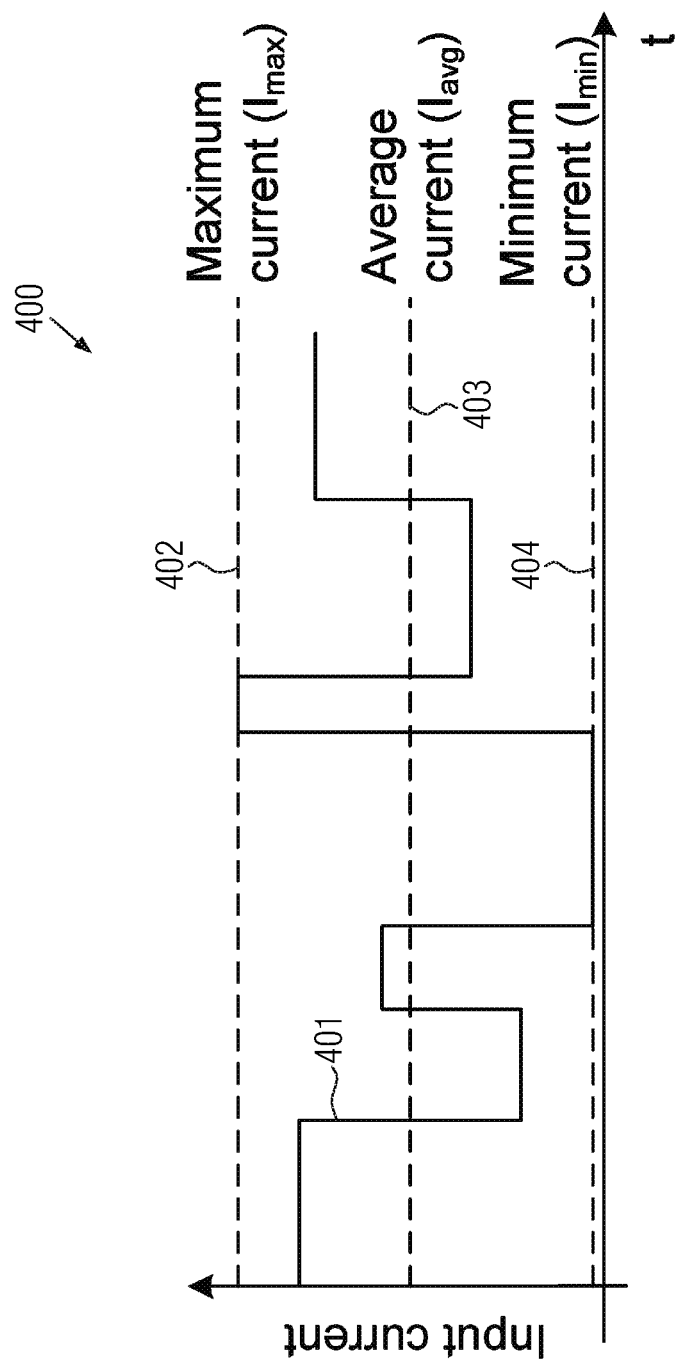
FIG. 4: Exemplary time series of an exemplary input current signal

FIG. 4 exemplary shows a time series 400 of an exemplary input current signal 401, e.g. an exemplary photocurrent signal from a photo detector, e.g. a photo diode (not shown).

This figure illustrates the transient evolution of a transmission signal for a given average optical light power level (i.e., for a given fiber length, temperature, process, etc). The time scales shown can, for example, be of the order of hundred of MHz or GHz.

As shown, the exemplary input current signal 401, can vary between a maximum input current level 402 and a minimum input current level 404, and may have an average input current level denoted by the reference numeral 403.

The difference between the maximum input current level 402 and the minimum input current level 404 can define the input voltage swing or variation of the input current.

For example, in case of an analog transmission, between these two values 402, 404, the trans-mission signal can take any value, and the optical receiver (circuit) is in charge of interpreting it as the digital transmitted signal.

The average current 403 exemplary represents the DC component of the received input signal. As this DC component is not necessarily needed to reconstruct the transmission signal in the receiver, it can be removed by, for example, a DC restoration component, such as for example the DC restoration component 308 of FIG. 3.

Furthermore, the average input current 403 can provide a good estimation of the maximum input amplitude of the received photocurrent. In an optical transmission, the difference between $I_{max}$ and $I_{min}$ is given by the following relation:

$$I_{max} - I_{min} = 2 \cdot \frac{ER - 1}{ER + 1} \cdot I_{avg},$$

where ER is known as the extinction ratio and can be defined for a given communication protocol.

Therefore, for a given ER, the maximum input current swing can be calculated using the average current 403 and for adapting the equivalent transimpedance of the transimpedance amplifier to get a defined output voltage swing at the output of the transimpedance amplifier.

It is important to remark that depending of the level of the received optical power, the average current variation can be up to three orders of magnitude or more.

Figure 5:
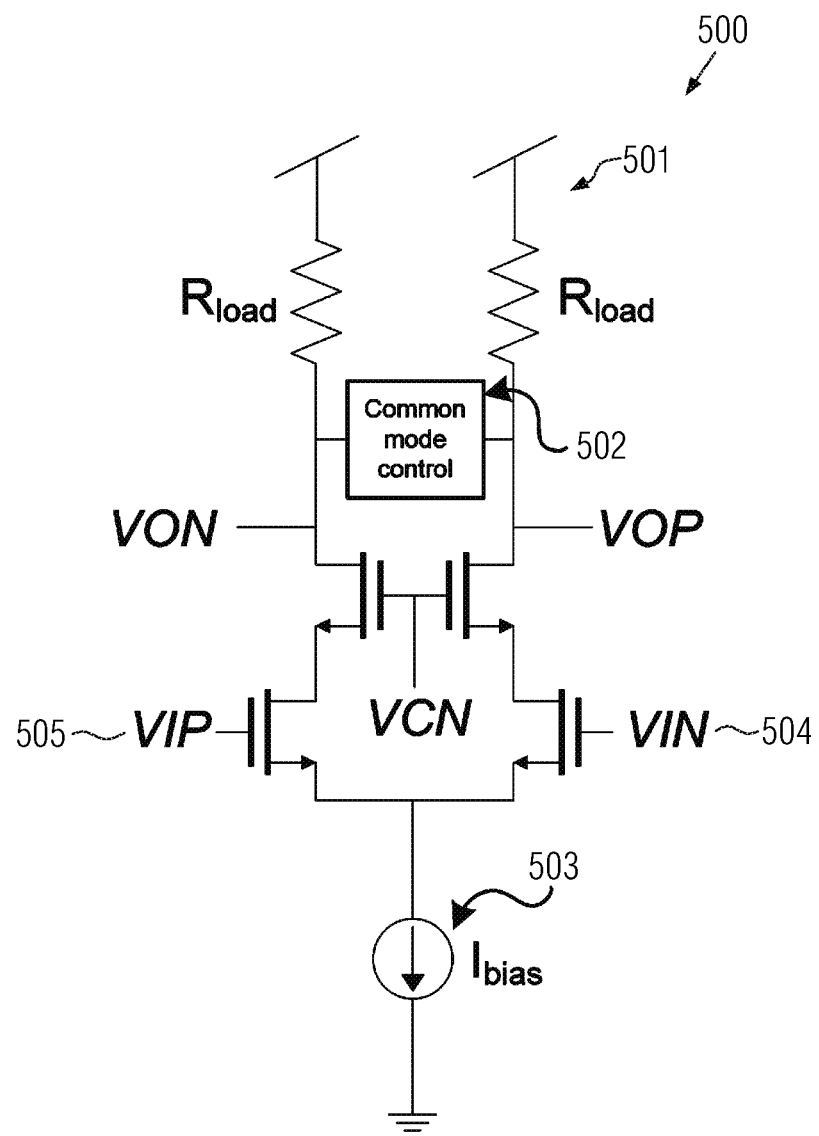
FIG. 5: Example of a gain amplifier stage

FIG. 5 exemplary shows a gain amplifier 500, for example, a gain amplifier of a first gain amplifier stage (not shown).

In this example, the gain amplifier can comprise a cascoded transistor with a resistive load $R_{load}$ 501.

In lieu of the resistive load $R_{load}$, also a PMOS (p-channel metal-oxide-semiconductor) load may be used, when optimizing a desired balance between gain, input referred noise and corner variations.

The cascoded transistor can be a cascoded NMOS (n-channel metal-oxide-semiconductor) field-effect transistor, which inter alia can improve the current noise characteristics of the transimpedance amplifier circuit (not shown), as the input referred noise of the transimpedance amplifier circuit can be inversely proportional to the equivalent transconductance of the input differential pair and the equivalent input capacitance.

However, also other transistor types, such as PMOS (p-channel metal-oxide-semiconductor) field-effect transistor are possible.

Furthermore, also other technologies, such as, for example, Bipolar (bipolar junction transistor technology), BiCMOS (combination of bipolar junction transistor technology and complementary metal-oxide-semiconductor technology), GaAs (Gallium Arsenide) based technology, etc. can be used in the implementation of the gain amplifier 500.

A cascoded transistor can inter alia allow increasing the equivalent impedance of the input differential pair 504, 505 (of the transimpedance amplifier circuit) to obtain a higher gain.

The gain and the output impedance of the gain amplifier can be scaled with the equivalent transimpedance of the transimpedance amplifier circuit (not shown).

The bias current $I_{bias}$, 503, of the input differential pair can inter alia be obtained from a transconductance control circuit (not shown) that keeps a constant transconductance along possible process/voltage/temperature (PVT) variations in the optical receiver circuit, thereby improving the stability control, linearity and noise performance of the optical receiver circuit under all conditions.

In other words, bias current $I_{bias}$, 503, can vary with the PVT variations to facilitate keeping the gain constant for all PVT variations, thereby inter alia facilitating the closed-loop response and keeping a similar performance in all corners.

Furthermore, the gain amplifier 500 can comprise a common-mode control component 502 for controlling the reverse bias voltage of the input photo detector, i.e. the input photo diode. This can inter alia improve the control and stability of the output common mode voltage and can improve the performance of the possible following gain amplifier stage.

While the above described architecture and topology can be implanted in the gain amplifier of a first gain amplifier stage to improve the input referred noise of the transimpedance amplifier circuit, the possible other subsequent stages can follow a similar architecture and topology.

Figure 6:
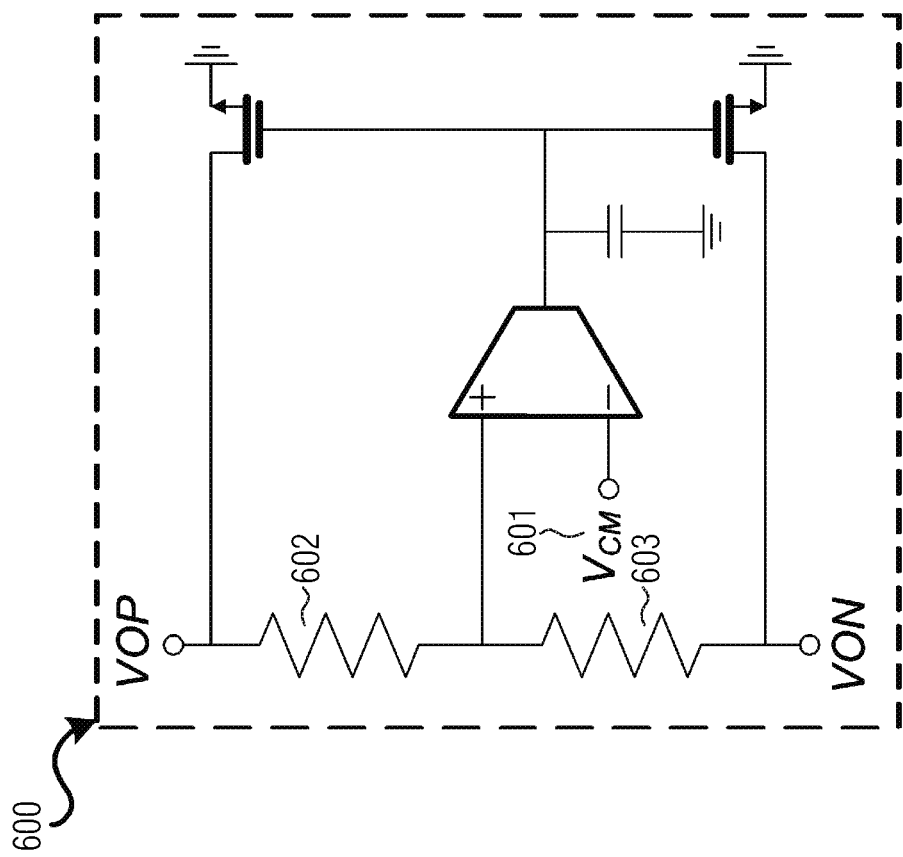
FIG. 6: Exemplary common-mode control circuitry

FIG. 6 exemplary shows an exemplary common-mode control circuitry component 600 that can be implemented in the gain amplifiers of a gain amplifier stage of a transimpedance amplifier circuit of an optical receiver circuit (not shown), i.e., for example, all gain amplifiers can have common-mode control circuitry component.

A common-mode control circuitry component can serve to compensate the variations of the bias current $I_{bias}$, without significantly influencing the amount of current going through the input differential pair and maintaining the transconductance properties and functionalities.

In the present example, the common-mode control circuitry component 600 can sample the output node of the gain amplifier stage (not shown) by means of two large resistors 602, 603 in order to avoid modifying the output impedance of the gain amplifier stage (not shown).

Said large resistors 602, 603 may, for example, have resistance values in the range of hundreds of kilo-ohms to few mega-ohms.

Thereby the common-mode can be compared to a reference value 601, $V_{CM}$, and the difference can be low-pass filtered, for example, by means of a 1 kHz transconductance-capacitance filter.

The common-mode can then be adjusted by subtracting the corresponding current from the output nodes, for example, by means of a transistor, for example, an NMOS transistor.

For completeness, it is noted that the common-mode control circuitry component topology is not limited to the proposed transconductance-capacitance scheme or MOS transistor, but that the common-mode control circuitry component could be implemented by other means performing the functionalities and steps described above.

Figure 7:
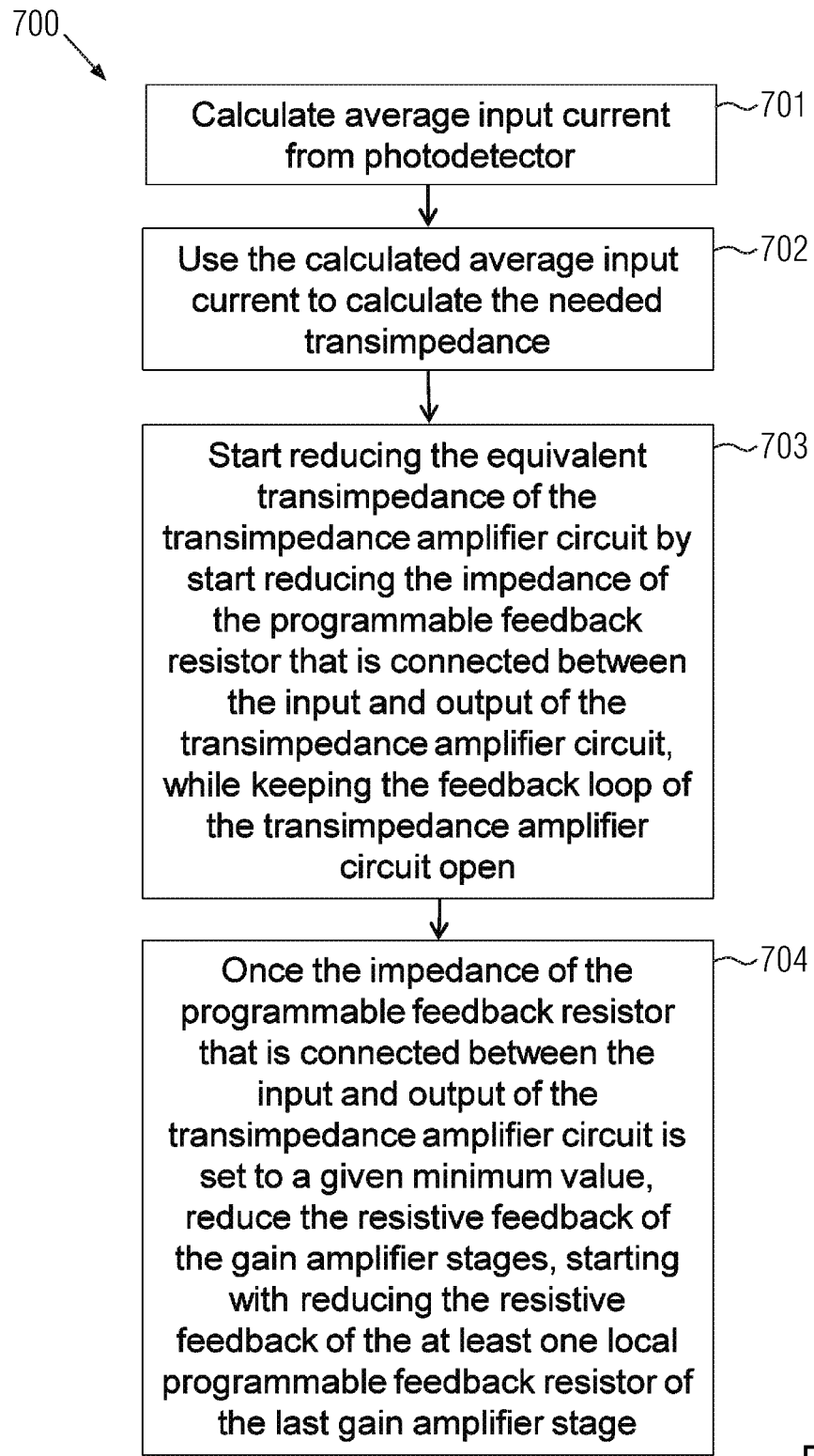
FIG. 7: Exemplary impedance control sequence

FIG. 7 exemplary shows possible steps of a control sequence 700 for controlling the equivalent transimpedance of the transimpedance amplifier circuit of an optical receiver circuit (not shown) in a stable manner.

The exemplary sequence steps can, for example, be carried out by an automatic gain control component (not shown) and can include one, some or all of the following steps and in varying order of steps:

Step 701: calculate an average input current from photo detector, e.g. photodiode Step 702: use the calculated input current to calculate the needed transimpedance Step 703: start reducing the equivalent transimpedance of the transimpedance amplifier circuit by start reducing the impedance of the programmable feedback resistor that is connected between the input and output of the transimpedance amplifier circuit, while keeping the feedback loop of the transimpedance amplifier circuit open Step 704: once the impedance of the programmable feedback resistor, that is connected between the input and output of the transimpedance amplifier circuit, is set to a given minimum value, reduce the resistive feedback of the gain amplifier stages, starting with reducing the resistive feedback of the at least one local programmable feedback resistor of the last gain amplifier stage.

In parallel to step 703 and 704 the resistive feedback of the other local programmable feedback resistors of other gain amplifier stage can be reduced to reduce the gain of the other gain amplifier stages and to further control the stability of the transimpedance amplifier circuit of an optical receiver circuit.

The described steps and sequences are exemplary only and other sequences comprising moving the gain of the different gain amplifier stages by means of programmable feedback resistors/shunt resistors are conceivable too, as well as other steps and means for reducing the impedance between the input and output of the transimpedance amplifier circuit are possible too.

Figure 8:
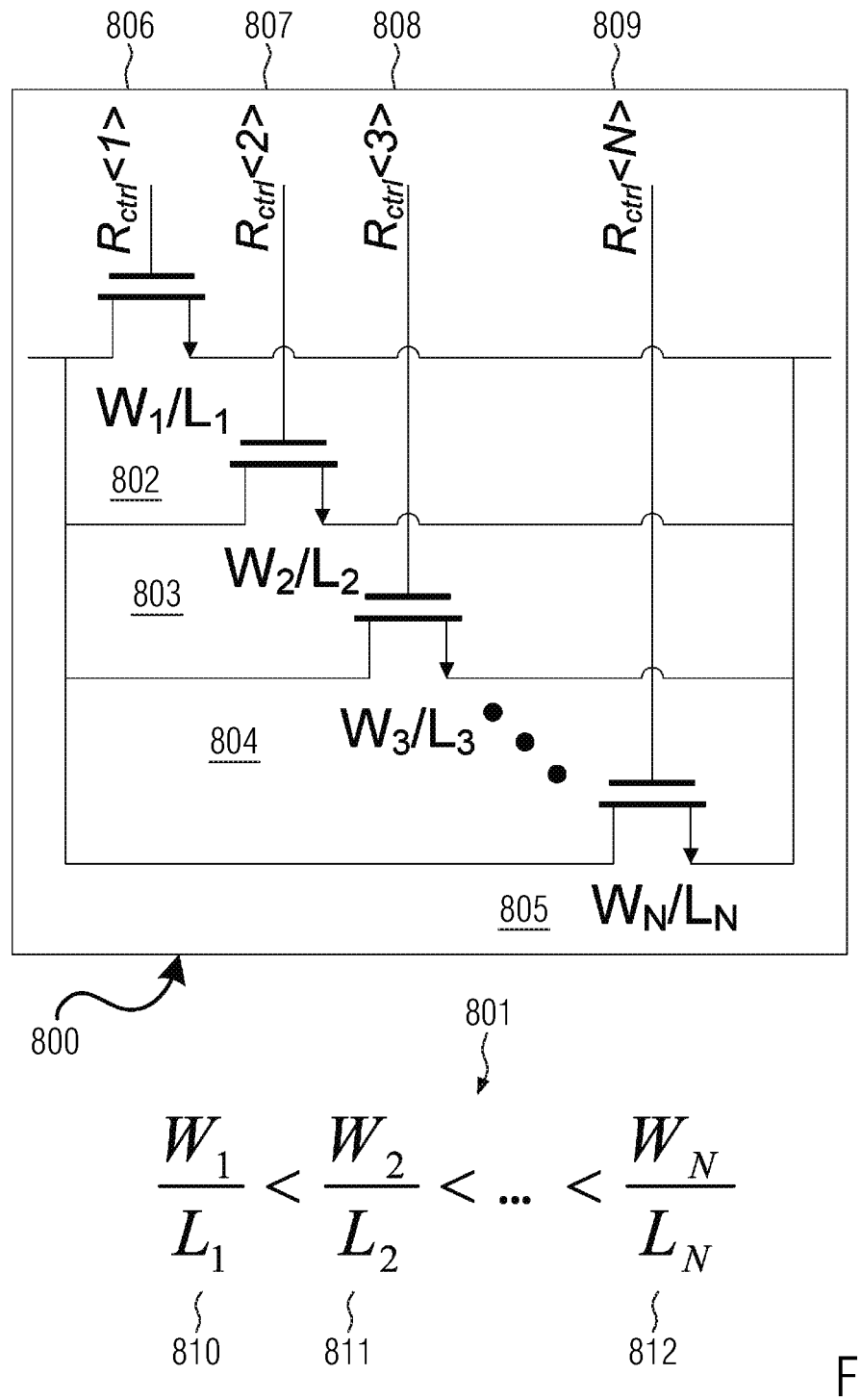
FIG. 8: Exemplary architecture of a programmable feedback resistor

FIG. 8 exemplary shows an implementation of a programmable feedback resistor 800, e.g. of a local or global programmable feedback resistor or of a programmable feedback resistor connected between the input and output of the transimpedance amplifier circuit.

For example, in an exemplary optical receiver circuit (not shown), some or each of the programmable feedback resistors can comprise a plurality of transistors 802, 803, 804, 805 connected in parallel and wherein the resistance of the programmable feedback resistors is controlled via the gate voltage(s) of their transistors 806, 807, 808, 809, and wherein some or all of the transistors 802, 803, 804, 805 of a programmable feedback resistor can have different characteristics, for example, can differ in scale or size, e.g. differ in their gate-width-to-gate-length ratio 810, 811, 812, e.g. in their gate-width-to-gate-length ratio from the first to the last transistor of the respective programmable feedback resistor.

The possible different characteristics of said transistors can inter alia reduce linearity problems and improve the operation of the programmable feedback resistors at ohmic region for the full dynamic range.

For example, MOS transistors, e.g. CMOS transistors, operate in ohmic region when $V_{DS} < V_{DS,Set}$, wherein $V_{DS}$ is the drain to source voltage and $V_{DS,Set}$ is the drain to source voltage when entering the saturation region and non-linear behavior occurs.

transistors can, for example, be configured and designed for maximizing the $V_{GE}$ operating point to improve the linearity behavior for the whole range of equivalent impedances.

Furthermore, a successively activation of the transistors 802, 803, 804, 805 from smaller gate-width-to-gate-length ratio to bigger gate-width-to-gate-length ratio is possible, as shown in exemplary sequence 801.

Such exemplary successively activations of the transistors of the programmable feedback resistors of the optical receiver circuit can improve the linearity of equivalent impedance transitions, for example, the linearity of equivalent impedance transitions from high equivalent impedance values to low equivalent impedance values.

Figure 9:
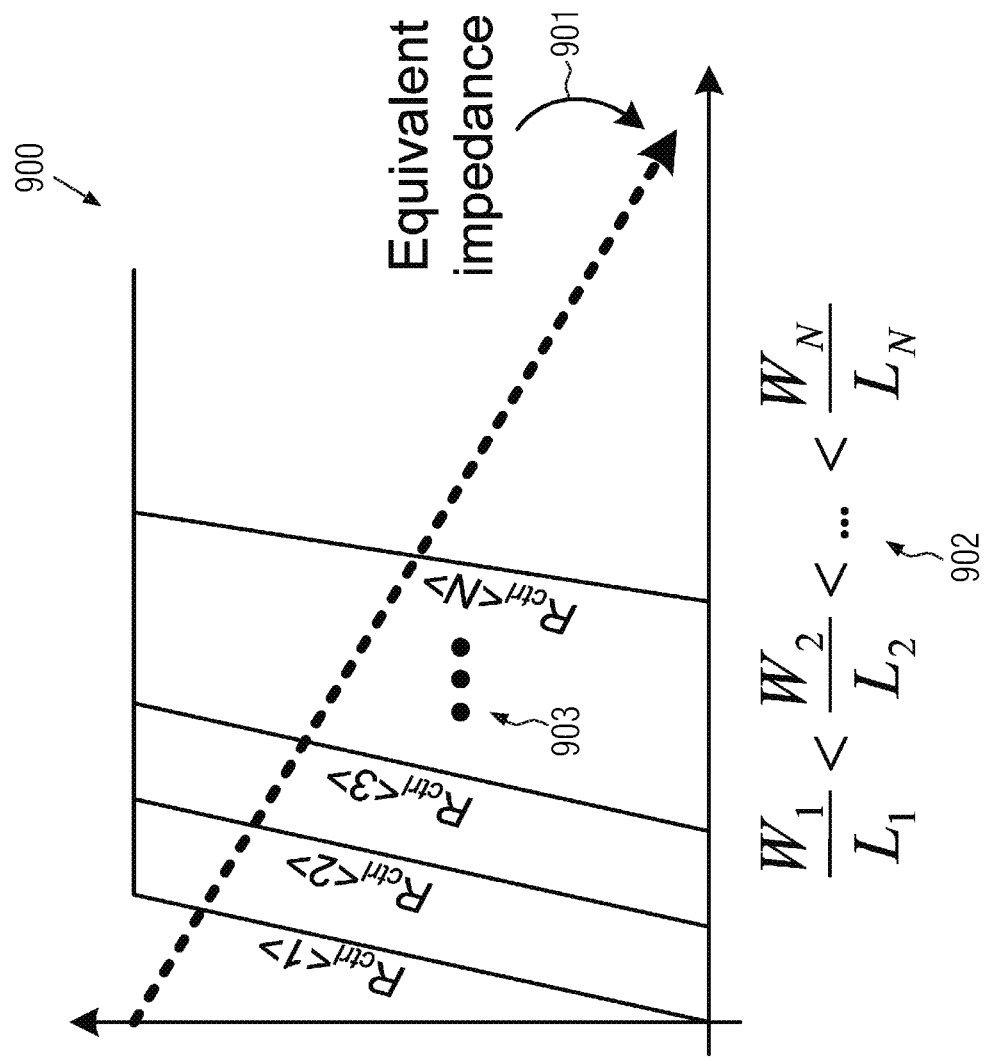
FIG. 9: Exemplary activation sequence of transistors in an exemplary programmable feedback resistor

FIG. 9 exemplary shows a possible linear decrease behavior 900 of the equivalent impedance 901 for a programmable feedback resistor (not shown) of an optical receiver circuit (not shown) when an exemplary gate-width to gate-length dependence 902 of the transistors (not shown) of a programmable feedback resistor is carried out.

For example, an activation sequence analogous to the one described above, with an activation of the transistors from smaller gate-width-to-gate-length ratio to bigger gate-width-to-gate-length ratio, and wherein said transistors control the gate voltages 903 of the programmable feedback resistors (not shown).

The design of the programmable feedback resistors described above and the sequential activation of the transistors operating in a sufficiently high and optimized $V_{GS} V_{tk}$ regime can ensure a good linear behavior over the full dynamic range.

For completeness, it is noted that the shown possible linear decrease behavior 900 can also be valid for the equivalent transimpedance behavior of the transimpedance amplifier circuit.

Figures 10A, 10B, 10C:
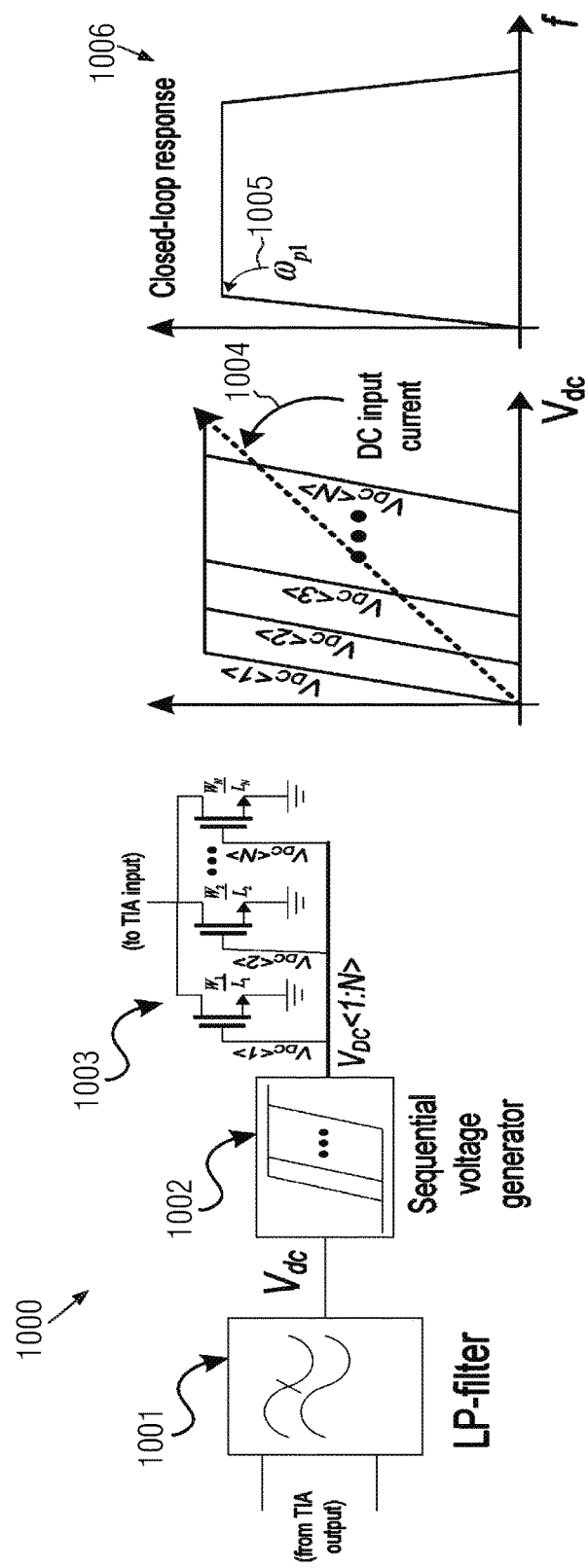
FIG. 10a: Exemplary DC restoration component architecture
FIG. 10b: Exemplary voltage generation sequence in dependence of DC input current
FIG. 10c: Exemplary closed loop response of exemplary transimpedance amplifier circuit

FIG. 10a exemplary shows a possible DC restoration component architecture 1000, wherein the DC restoration component can comprise a low-pass filter 1001.

The DC restoration component can remove the input DC current, i.e. the average current, $I_{avg}$, of the current signal generated by the at least one photo detector, i.e. the photocurrent, for example, by means of a closed-loop control, which can involve a low-pass filtering of the output voltage of the transimpedance amplifier circuit (TIA, not shown) to calculate its DC component, $V_{DC}$.

The low-pass filter 1001 can be followed by a sequential voltage generator 1002 and a current source 1003 which generates the equivalent DC current to be subtracted from the transimpedance amplifier input and that can be built by means of a set of parallel transistor controlled by the sequential voltage control voltage $V_{DC}$ generated by the sequential voltage generator, which can be configured for a continuous control of the DC voltage.

FIG. 10b exemplary shows the linear behaviour 1004 of the DC input current in dependence of the calculated DC voltage component $V_{DC}$ for a possible DC restoration component architecture, such as, for example, the DC restoration component architecture 1000.

FIG. 10c exemplary shows the closed-loop control response behaviour 1006 of a possible transimpedance amplifier circuit architecture with a possible DC restoration component architecture together, such as, for example, the DC restoration component architecture 1000 and the transimpedance amplifier circuit architecture described above. The transimpedance amplifier circuit closed-loop response together with the DC restoration can form a band-pass filter which lower corner frequency or low frequency pole 1005, $\omega_{pl}$, can be given by $\omega_{pl} = T_{z0} \cdot g_{m,cs} \cdot GBW_{LPF}$, wherein $T_{z0}$ is the equivalent transimpedance, $g_{m,cs}$ is the equivalent transconductance of the current source, e.g. the set of parallel transistors of the current source component 1003 of FIG. 10a, and $GBW_{LPF}$ is the gain bandwidth product of the low-pass filter.

Said lower corner frequency $\omega_{pl}$ or low frequency pole 1005 can be kept constant for all the possible transimpedance range, thereby preventing inter alia a baseline wandering of the communication signal processed by the optical receiver circuit. Furthermore, the equivalent transconductance $g_{m,cs}$ can move together with the equivalent transimpedance $T_{z0}$.

The DC current generated by the DC restoration component, i.e. the DC current signal outputted by the DC restoration component, can, for example, be generated by means of an array of scaled transistors that can be activated sequentially as the DC voltage output increases as, for example, the ones shown in FIG. 10a.

In addition the equivalent transconductance $g_{m,cs}$ of the current source can be reduced to reduce the current noise of the DC restoration injected at the input of the transimpedance amplifier. The use of the sequential voltage activation of the current source can help to minimize the current noise injection.

The described architecture inter alia can allow keeping a constant $T_{z0} \cdot g_{m,cs}$ product and at the same time reducing the amount of noise injected into the transimpedance amplifier circuit input, as the transistors used in this architecture can, for example, as described above, e.g. FIG. 8, be configured and designed for maximizing their gate source voltage $V_{GS}$ operating point.

For example, the higher the gate source voltage $V_{GS}$, the smaller the $g_m/I_D$, the so called inversion coefficient, resulting in less spectral noise density of the transistors and better overall performance of the optical receiver circuit.

It is again noted for completeness that the transistors that can be used are not limited to a MOS (metal-oxide-semiconductor), e.g. CMOS (complementary metal-oxide-semiconductor), architecture based implementation.

Figure 11:
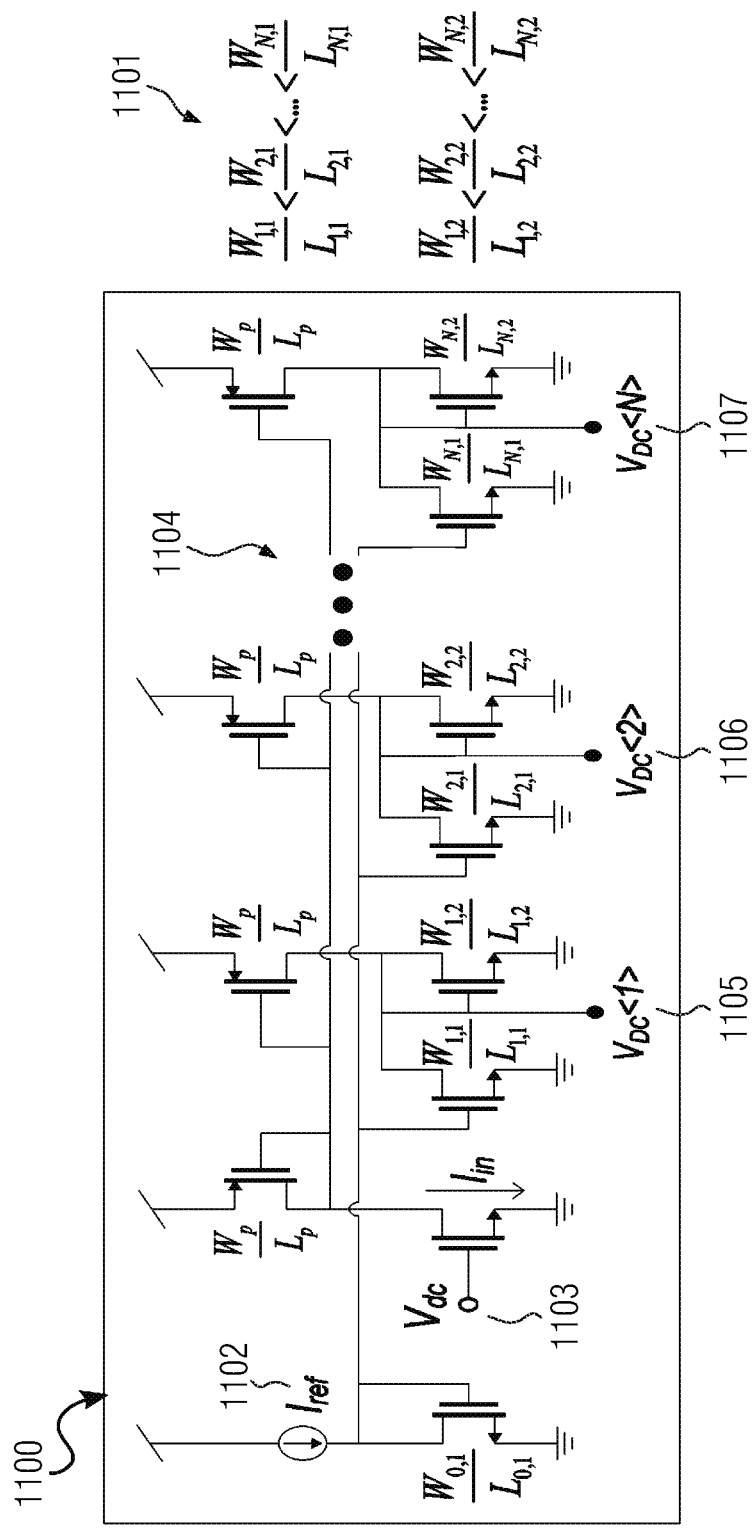
FIG. 11: Exemplary sequential voltage control architecture

FIG. 11 exemplary shows a possible sequential voltage control component 1100 for continuous voltage control which, for example, can be used in DC restoration component (not shown) of an optical receiver circuit as described above.

The exemplary possible sequential voltage control component 1100 can receive an input current reference $I_{ref}$ and a signal $V_{dc}$ coming from a/the low pass filter (not shown), which can be translated into a current $I_{in}$ proportional to the output DC voltage of the DC restoration component (not shown).

Said translated input voltage-dependent current $I_{in}$ can then be copied by means of a current mirror 1104 along an array of scaled of copies of the reference current $I_{ref}$.

As shown a diode-connected transistor, for example, a diode-connected NMOS transistor, can convert exceeding current into voltage and thereby building the sequential bits, e.g. rising from a minimum to a maximum value sequentially, along the array.

For example, in case the current input voltage $V_{dc}$ is small, all the output voltages 1105, 1106, 1107, are low.

Thereby typical voltages can be in the range of 1 to 5V.

Due to the different width-to gate length ratios of the MOS transistors, as shown in exemplary sequence 1101, as the voltage $V_{dc}$ grows, the different output voltages $V_{DC}<i>$, 1105, 1106, 1107 (with i being a natural number greater 1), are sequentially activated.

In addition a proper sizing, i.e. a proper dimensioning of the width-to-gate length ratios, can exactly control the activation sequence.

Figure 12:
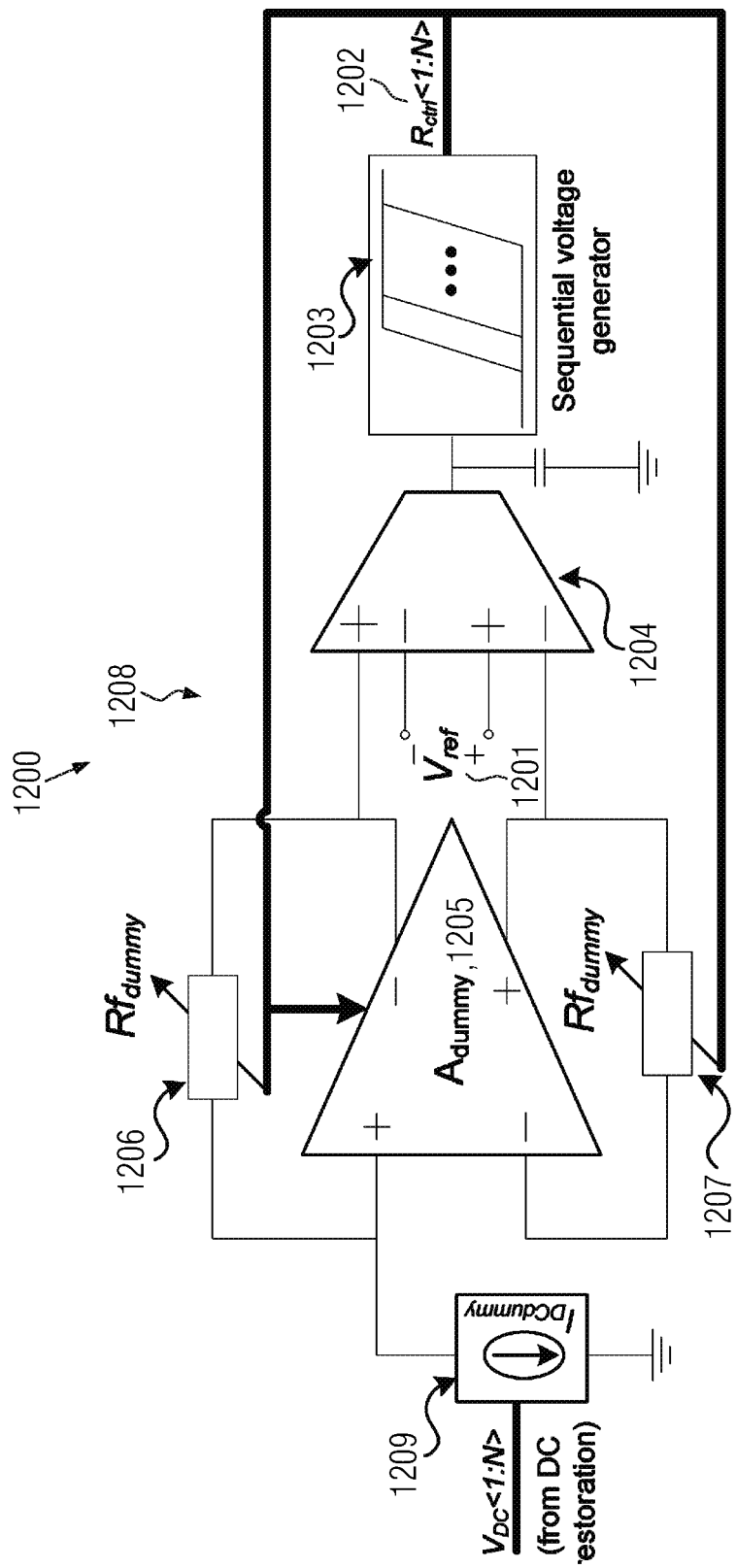
FIG. 12: Exemplary architecture of an automatic gain control component

FIG. 12 exemplary shows an automatic gain control component 1200. The automatic gain control carried out by automatic gain control component 1200 can be based on a/the DC current 1209 generated by the DC restoration component (not shown) and a scaled version of the main transimpedance amplifier circuit (TIA), called dummy transimpedance amplifier circuit (dummy TIA) 1208.

In other words the exemplary automatic gain control component 1200 can, for example, comprise at least one dummy gain amplifier stage with a dummy gain amplifier 1205 and dummy programmable feedback resistors 1206, 1207, as well as an output buffer.

In fact the dummy transimpedance amplifier circuit 1208 can have, for example, the same number of dummy gain amplifier stages, the same number of dummy gain amplifiers and the same number of dummy programmable feedback resistors as the main transimpedance amplifier circuit (not shown), but their characteristic values and properties can be scaled such as to have a lower power consumption but the same DC characteristics (e.g. same equivalent DC gain and same equivalent transimpedance) to facilitate correct calibration of the optical receiver circuit.

Furthermore, the DC current, i.e. the average current, $I_{avg}$, of the current signal generated by the at least one photo detector, i.e. the photocurrent, can be proportional to the amplitude of the AC (alternating current) component of the input signal.

The reference signal 1201 can, for example a reference voltage, represent a/the maximum output voltage amplitude allowed at the main transimpedance amplifier circuit output (not shown).

The possible block following the dummy transimpedance amplifier circuit 1208 can have a high gain, e.g. of up to 60 dB or more, and can generate an output voltage proportional to the difference between the dummy transimpedance amplifier circuit 1208 and the reference voltage 1201.

Said block may further comprise a sequential voltage generator 1203 and that can be similar to the possible sequential voltage generator of the DC restoration component.

Said sequential voltage generator 1203 can create sequentially voltage control signals 1202 ($R_{ctrl}<1:N>$) that can drive the programmable feedback resistors of both the dummy transimpedance amplifier circuit 1208 and the main transimpedance amplifier circuit.

Figure 13:
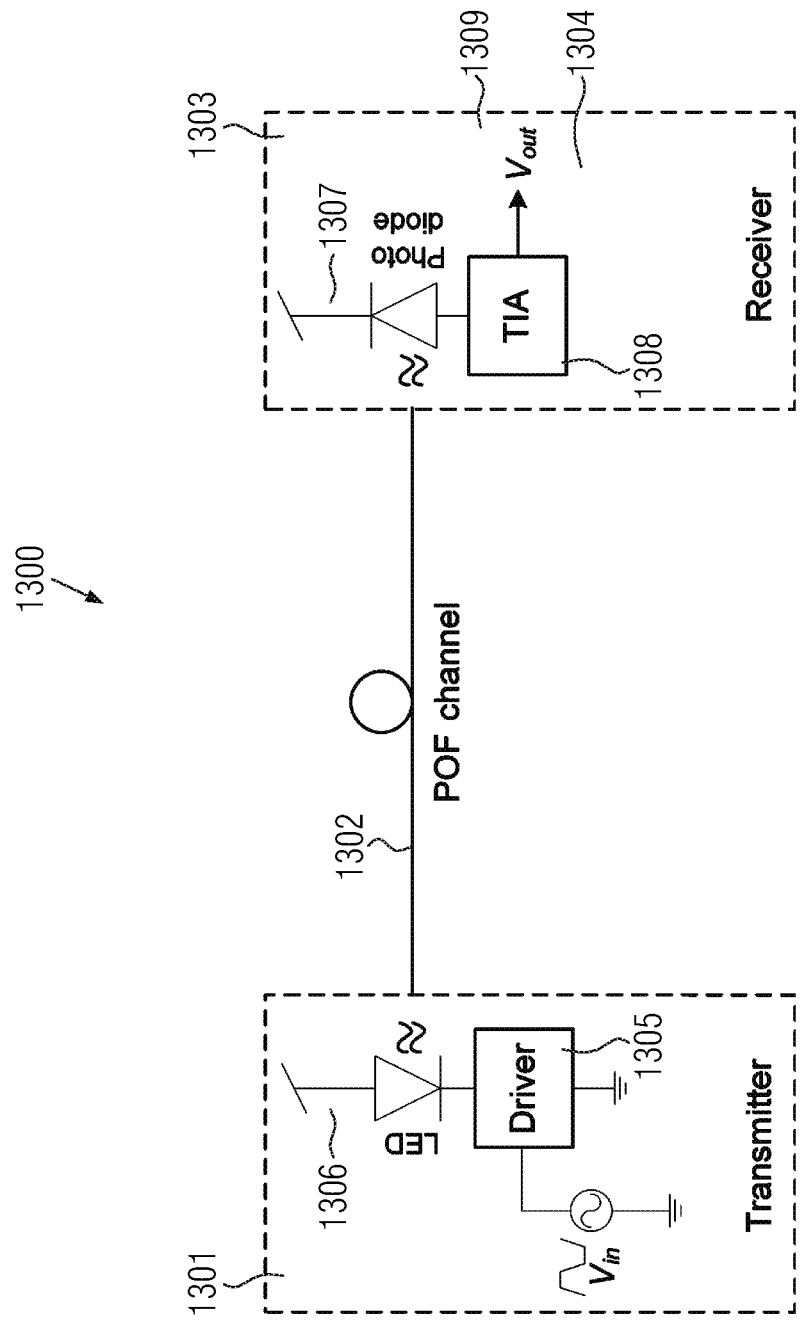
FIG. 13: Example of an optical communication system

FIG. 13 exemplary shows an optical communication system 1300 comprising an optical transmitter 1301, an optical fiber link 1302, e.g. a plastic fiber, and an optical receiver 1303.

In this exemplary optical communication system 1300 a light emitting device, e.g. light emitting diode (LED) 1306 driven by an LED driving circuit 1305, of the optical transmitter, outputs an optical signal that is fed into an optical fiber link 1302, e.g. a plastic fiber, which guides the optical signal to a light receiving device, the optical receiver 1303, where the light is for example received by a photo diode 1307. The light received by the photo diode 1307 generates a photocurrent that is converted, for example, by a trans-impedance amplifier circuit (TIA) 1308 according to and consistent with the exemplary architecture(s) described above, into an electrical voltage output signal 1309.

Furthermore, in this exemplary optical communication system 1300 the optical receiver 1303 comprises an optical receiver circuit 1304 according to and consistent with the exemplary architecture(s) of an optical receiver circuit described above.

For completeness it is noted that the exemplary architecture(s) of an optical receiver circuit described above is/are not limited to a MOS (metal-oxide-semiconductor) architecture based implementation. The design of the architecture of an optical receiver circuit exemplary described above is also compatible with any other technology, such as, for example, Bipolar (bipolar junction transistor technology), BiCMOS (combination of bipolar junction transistor technology and complementary metal-oxide-semiconductor technology), GaAs (Gallium Arsenide) based technology, etc.

Followed by 13 sheets comprising 13 figures.

The reference numerals identify the following components:

100 Exemplary schematic architecture of parts of an optical receiver circuit

101 Exemplary transimpedance amplifier circuit

102 Exemplary input/input signal, e.g. input current signal, of transimpedance amplifier circuit

103 Exemplary output/output signal, e.g. output voltage signal, of transimpedance amplifier circuit

104 Exemplary photo detector, e.g. a photo diode

105 Exemplary local/global programmable feedback resistor

106 Exemplary local programmable feedback resistor

107 Exemplary local programmable feedback resistor

108 Exemplary local programmable feedback resistor

109 Exemplary local/global programmable feedback resistor

110 Exemplary local programmable feedback resistor

111 Exemplary local programmable feedback resistor

112 Exemplary local programmable feedback resistor

113 Exemplary programmable feedback resistor for controlling the equivalent transimpedance of the transimpedance amplifier circuit 114 Exemplary programmable feedback resistor for controlling the equivalent transimpedance of the transimpedance amplifier circuit
115 Exemplary programmable feedback resistor for controlling the equivalent transimpedance of the transimpedance amplifier circuit
116 Exemplary programmable feedback resistor for controlling the equivalent transimpedance of the transimpedance amplifier circuit
117 Exemplary programmable feedback resistor for controlling the equivalent transimpedance of the transimpedance amplifier circuit
118 Exemplary programmable feedback resistor for controlling the equivalent transimpedance of the transimpedance amplifier circuit
119 Exemplary gain amplifier
120 Exemplary gain amplifier
121 Exemplary gain amplifier
122 Exemplary gain amplifier
123 Exemplary (first) gain amplifier stage
124 Exemplary gain amplifier stage
125 Exemplary gain amplifier stage
126 Exemplary (last) gain amplifier stage
200 Exemplary optical receiver circuit
201 Exemplary transimpedance amplifier circuit
202 Exemplary input/input signal, e.g. input current signal, of transimpedance amplifier circuit
203 Exemplary output/output signal, e.g. output voltage signal, of transimpedance amplifier circuit
204 Exemplary automatic gain component
205 Exemplary DC restoration component
206 Exemplary dark (dummy) photo detector, dark (dummy) photo diode, or equivalent electrical model of a photo detector/photo diode
207 Exemplary photo detector, e.g. a photo diode
208 Exemplary possible low-pass filter
209 Exemplary (first) gain amplifier stage
210 Exemplary gain amplifier stage
211 Exemplary (last) gain amplifier stage
212 Exemplary (first) gain amplifier
213 Exemplary gain amplifier
214 Exemplary (last) gain amplifier
215 Exemplary local/global programmable feedback resistor
216 Exemplary local/global programmable feedback resistor
217 Exemplary local programmable feedback resistor
218 Exemplary local programmable feedback resistor
219 Exemplary local programmable feedback resistor
220 Exemplary local programmable feedback resistor
221 Exemplary fixed (global) resistor between input and output of transimpedance amplifier circuit
222 Exemplary unity gain amplifier, exemplary buffer
223 Exemplary unity gain amplifier, exemplary buffer
224 Exemplary shunt programmable resistor
225 Exemplary fixed resistor between input and output of transimpedance amplifier circuit
226 Exemplary (global) programmable feedback resistor for controlling the equivalent transimpedance of the transimpedance amplifier circuit
227 Exemplary (global) programmable feedback resistor for controlling the equivalent transimpedance of the transimpedance amplifier circuit
300 Exemplary optical receiver circuit
301 Exemplary input/input signal, e.g. input current signal, of transimpedance amplifier circuit
302 Exemplary output/output signal, e.g. output voltage signal, of transimpedance amplifier circuit
303 Exemplary transimpedance amplifier circuit
304 Exemplary gain amplifier
305 Exemplary (local/global) programmable feedback resistor
306 Exemplary (local/global) programmable feedback resistor
307 Exemplary automatic gain component
308 Exemplary DC restoration component
309 Exemplary photo detector, e.g. a photo diode
310 Exemplary dark (dummy) photo detector, dark (dummy) photo diode, or equivalent electrical model of a photo detector/photo diode
311 Exemplary output buffer
400 Exemplary time series of an exemplary input current signal
401 Exemplary input current signal, e.g. photocurrent signal
402 Exemplary maximum input current level, exemplary maximum input current signal
403 Exemplary average input current level, exemplary average input current signal
404 Exemplary minimum input current level, exemplary minimum input current signal
500 Exemplary gain amplifier, e.g. exemplary gain amplifier of a first gain amplifier stage
501 Exemplary resistive load, for example resistive load of a cascoded transistor
502 Exemplary common-mode control component
503 Exemplary bias current
504 Exemplary part of differential input pair
505 Exemplary part of differential input pair
600 Exemplary common-mode control circuitry component
601 Exemplary reference value
602 Exemplary (first) large resistor, exemplary resistance to calculate the output common-mode
603 Exemplary (second) large resistor, exemplary resistance to calculate the output common-mode
700 Exemplary control sequence
701 Exemplary control sequence step
702 Exemplary control sequence step
703 Exemplary control sequence step
704 Exemplary control sequence step
800 Exemplary implementation of a programmable feedback resistor
801 Exemplary sizing of gate-width-to-gate-length ratios
802 Exemplary transistor
803 Exemplary transistor
804 Exemplary transistor
805 Exemplary transistor
806 Exemplary gate control voltage of a programmable resistance
807 Exemplary gate control voltage of a programmable resistance
808 Exemplary gate control voltage of a programmable resistance
809 Exemplary gate control voltage of a programmable resistance
810 Exemplary gate-width-to-gate-length ratio
811 Exemplary gate-width-to-gate-length ratio
812 Exemplary gate-width-to-gate-length ratio
900 Exemplary behavior of linear decrease of equivalent impedance
901 Exemplary equivalent impedance of programmable feedback resistor 902 Exemplary transistor dimensions dependence of the programmable resistor(s)
903 Exemplary gate control voltages of the programmable feedback resistor(s)
1000 Exemplary DC restoration component architecture
1001 Exemplary low-pass filter
1002 Exemplary sequential voltage generator
1003 Exemplary sequential current source component, for example, set of parallel transistors
1004 Exemplary behaviour of DC input current
1005 Exemplary low frequency pole
1006 Exemplary closed-loop control response behaviour
1100 Exemplary sequential voltage control component
1101 Exemplary dependence of gate-width-to-gate-length ratios
1102 Exemplary input current reference, $I_{ref}$
1103 Exemplary signal from low-pass filter
1104 Exemplary current mirror
1105 Exemplary output voltage
1106 Exemplary output voltage
1107 Exemplary output voltage
1200 Exemplary automatic gain control component
1201 Exemplary reference signal, e.g. representing maximum output voltage amplitude allowed at the main transimpedance amplifier circuit output
1202 Exemplary voltage control signals
1203 Exemplary sequential voltage generator
1204 Exemplary output buffer
1205 Exemplary dummy gain amplifier
1206 Exemplary dummy programmable feedback resistor
1207 Exemplary dummy programmable feedback resistor
1208 Exemplary dummy transimpedance amplifier circuit
1209 Exemplary DC (dummy) current signal generated by DC restoration component
1300 Exemplary optical communication system
1301 Exemplary optical transmitter
1302 Exemplary optical fiber link
1303 Exemplary optical receiver
1304 Exemplary optical receiver circuit
1305 Exemplary LED driver circuit
1306 Exemplary light emitting device, e.g. light emitting diode (LED)
1307 Exemplary photo detected, e.g. photo diode
1308 Exemplary transimpedance amplifier circuit
1309 Exemplary output signal, e.g. voltage output

We claim:

1. An optical receiver circuit (200) comprising:
at least one photo detector (207) configured to convert a received light signal to an input current signal,
a transimpedance amplifier circuit (201) with an input to receive the input current signal from the at least one photo detector (207) and being configured to convert the received input current signal to an output voltage signal to generate an output signal of the transimpedance amplifier circuit (201), wherein the transimpedance amplifier circuit comprises a plurality of gain amplifier stages (209, 210, 211),
a DC restoration component (205), wherein the DC restoration component (205) is configured to receive the output voltage signal of the transimpedance amplifier circuit (201) for restoring the DC component of the received current signal and configured for outputting a corresponding current signal,
an automatic gain control component (204) configured for controlling via at least one programmable feedback resistor (226, 227) the equivalent transimpedance of the transimpedance amplifier circuit based on the signal output by the DC restoration component (205) to provide a constant output voltage amplitude for different current ranges of the input current signal;
wherein at least some of the gain amplifier stages (209, 210, 211) comprise a gain amplifier (212, 213, 214) and at least one local programmable feedback resistor (215, 216, 217, 218, 219, 220, 224) for controlling the gain of the respective gain amplifier stage (209, 210, 211, 214), wherein some of the local programmable feedback resistors are arranged to shorten the outputs of some of the gain amplifier stages (224), and wherein the automatic gain control component (204) is further configured to control at least some of the local programmable feedback resistors (215, 216, 217, 218, 219, 220) of the gain amplifier stages based on the signal output by the DC restoration component (205), and
wherein the at least one programmable feedback resistor (227, 227) for controlling the equivalent transimpedance of the transimpedance amplifier circuit (201) is arranged between the input of transimpedance amplifier circuit and the output signal of the transimpedance amplifier circuit.

2. Optical receiver circuit (200) according to claim 1, comprising a plurality of programmable feedback resistors (226, 227, 215, 216, 105, 109, 113, 114, 115, 116, 117, 118) for controlling the equivalent transimpedance of the transimpedance amplifier circuit (201,101), and wherein at least some of the programmable feedback resistors (215, 216, 105, 109, 114, 115, 116, 117) for controlling the equivalent transimpedance of the transimpedance amplifier circuit are connected between the input of the transimpedance amplifier circuit and outputs of the different gain amplifier stages (123, 124, 125, 126).

3. Optical receiver circuit (200) according to claim 1, further comprising a fixed resistor (221, 225) connected between the input and the output signal of the transimpedance amplifier circuit for limiting the maximum equivalent transimpedance of the transimpedance amplifier circuit, and/or
wherein the DC restoration component (205) is configured to subtract the DC component of the received current signal and wherein the automatic gain control component (204) is configured for controlling the equivalent transimpedance of the transimpedance amplifier circuit (201) based on a copy of the subtracted DC component.

4. Optical receiver circuit (200) according to claim 1, wherein the optical receiver circuit comprises two photo detectors (206, 207), wherein one photo detector (207) is configured to receive the light signal and the other photo detector (206) is shielded from the light signal and wherein the transimpedance amplifier circuit (201) has a differential topology with one branch, e.g. the positive branch (228), of the transimpedance amplifier circuit being connected to the photo detector (207) that is configured to receive the light signal and with the other branch, e.g. the negative branch (229), of the transimpedance amplifier circuit being connected to the photo detector (206) that is shielded from the light signal, or
wherein the optical receiver circuit comprises a transimpedance amplifier circuit with a differential topology with one branch, e.g. the positive branch, of the transimpedance amplifier circuit being connected to the photo detector that is configured to receive the light signal and with the other branch, e.g. the negative branch, of the transimpedance amplifier circuit being connected to an equivalent electrical model of the photodiode to a circuit comprising a resistor and/or capacitor.

5. Optical receiver circuit (200) according to claim 1, wherein at least some of the local programmable feedback resistors for controlling the gain of the gain amplifier stages (217, 218, 219, 220) are connected to local inputs and outputs of some of the gain amplifier stages and/or wherein at least some of the local programmable feedback resistors for controlling the gain of the gain amplifier stages are arranged to shorten the outputs of some of the gain amplifier stages (224).

6. Optical receiver circuit (200) according to claim 1, wherein the at least one gain amplifier stage comprises a differential pair, e.g. cascoded transistor, with a resistive load (501), or with an active load with a p-channel metal-oxide-semiconductor field-effect transistor, PMOS, load, and/or
wherein at least one, some, or each gain amplifier stage comprise a common-mode control circuit (502) for providing a signal suitable for controlling the reverse bias voltage of the photo detector.

7. Optical receiver circuit (200) according to claim 1, wherein the optical receiver circuit is configured to carry out one, some or all of the following steps:
calculate an average current of the current signal generated by the at least one photo detector based on a copy of the current outputted by the DC restoration component (205),
use the calculated average current to calculate a required equivalent transimpedance of the transimpedance amplifier circuit and for controlling the equivalent transimpedance of the transimpedance amplifier circuit (201) to provide a constant output voltage (203) amplitude for different current ranges of the input current signal reduce the gain of the gain amplifier stages (209, 210, 211).

8. Optical receiver circuit (200) according to claim 1, wherein the automatic gain control component (204) is configured to carry out one, some or all of the following steps (702, 703, 704) for controlling the equivalent transimpedance of the transimpedance amplifier circuit (201):
use the current outputted by the DC restoration component (205) to calculate a required equivalent transimpedance of the transimpedance amplifier circuit (201),
start reducing the equivalent transimpedance of the transimpedance amplifier circuit (201) by reducing the impedance of the at least one programmable feedback resistor (225, 226) connected between the input and output of the transimpedance amplifier circuit,
once the impedance of the at least one programmable feedback resistor (226, 227) connected between the input and output of the transimpedance amplifier circuit is set to a given minimum value, sequentially reducing the impedance of possible further programmable feedback resistors connected between the input of the transimpedance amplifier circuit and outputs of different gain amplifier stages (215, 216) by starting with reducing the impedance of a programmable feedback resistor connected between the input of the transimpedance amplifier circuit and the output of the last gain amplifier stage.

9. Optical receiver circuit (200) according to claim 1, wherein the automatic gain control component (204) is further configured to carry out the step of:
controlling the gain of the gain amplifier stages (209, 210, 211) by controlling, e.g. reducing, in sequence the resistive feedback or the shunt resistors of the local programmable feedback resistors of the gain amplifier stages (217, 218, 219, 220, 224) by starting controlling, e.g. reducing, the resistive feedback of the local programmable feedback resistor of the last gain amplifier stage (219, 220).

10. Optical receiver circuit (200) according to claim 1, wherein some or each of the programmable feedback resistors (215, 216, 217, 218, 219, 220, 224, 225, 226) comprise a plurality of transistors (802, 803, 804, 805) connected in parallel and wherein the resistance of the local programmable feedback resistors is controlled via the gate voltage (806, 807, 808, 809) of their transistors, and wherein some or all of the transistors of a programmable feedback resistor have different characteristics differ in scale or size, e.g. differ in their gate-width-to-gate-length ratio, e.g. increasing in their gate-width-to-gate-length ratio from the first to the last transistor of the respective programmable feedback resistor.

11. Optical receiver circuit (200) according to claim 10, wherein the transistors of a programmable feedback resistor are configured to be activated in sequence (900) configured to be activated in sequence from the first to the last transistor of the respective programmable feedback resistor.

12. Optical receiver circuit (200) according to claim 1, wherein the DC restoration component (205) comprises a sequential voltage generator (1002), wherein the sequential voltage generator output drives a current source that comprises a plurality of scaled transistors (1003), and wherein the scaled transistors are configured to be activated in sequence for increasing the DC current output of the DC restoration component, and wherein, for example, the DC restoration component comprises a low-pass filter (1001) connected to the output of the transimpedance amplifier circuit (203), wherein the output of the low-pass filter (1103) is used as input for the sequential voltage generator (1002), and wherein the DC current output of the DC restoration component is connected to the output of the at least one photo detector (207) that is connected to the input (228) of the transimpedance amplifier circuit (201), and/or
wherein the automatic gain control component (204) comprises a dummy transimpedance amplifier circuit (1208) that is a scaled version of the transimpedance amplifier circuit (201) according to one of the preceding claims, wherein the dummy transimpedance amplifier circuit (1208) comprises a plurality of dummy gain amplifier stages (1205), and wherein the dummy transimpedance amplifier circuit (1208) is configured to receive as input a copy of the DC current outputted by the DC restoration component (1209) and wherein the dummy transimpedance amplifier circuit is further configured to convert the received input current signal to a voltage signal to generate an output signal (1202) for controlling the equivalent transimpedance of the transimpedance amplifier circuit, and wherein each dummy gain amplifier stage comprises a dummy gain amplifier and at least one dummy local programmable feedback resistor.

13. Optical receiver circuit (200) according to claim 12, wherein the dummy transimpedance amplifier circuit (1208) has the same equivalent transimpedance for a given programmed state of the dummy programmable feedback resistors (1206, 1207) than the equivalent transimpedance of the transimpedance amplifier configured with the same programmed state of the programmable feedback resistors, and wherein the automatic gain control component is configured to carry out one, some or all of the following steps:

use a copy of the DC current outputted by the DC restoration component (1209) as an input of the dummy transimpedance amplifier circuit to transform this current into a voltage proportional to the required transimpedance, compare the output of the dummy transimpedance amplifier circuit to a given reference voltage (1201), and based on this comparison, generate a set of gate control voltages (1202) to program the transimpedance of the dummy transimpedance amplifier circuit by means of the dummy programmable feedback resistors, use the generated gate control voltages (1202) to set the equivalent transimpedance of the transimpedance amplifier circuit (201) to a value that sets the output voltage amplitude (203) the transimpedance amplifier circuit to a desired value.

14. Optical receiver (1303) for use in an optical communication system (1300) comprising at least one optical receiver circuit (1304) according to claim 1.

* * * * *